US006111183A

United States Patent [19]

Lindemann

[11] Patent Number: 6,111,183

[45] Date of Patent: Aug. 29, 2000

[54] AUDIO SIGNAL SYNTHESIS SYSTEM BASED ON PROBABILISTIC ESTIMATION OF TIME-VARYING SPECTRA

[76] Inventor: Eric Lindemann, 2975 18th St., Boulder, Colo. 80304

[21] Appl. No.: 09/390,918

[22] Filed: Sep. 7, 1999

[51] Int. Cl.[7] .............................. G10H 1/46; G10H 7/00; H03G 3/00

[52] U.S. Cl. ................................ 84/633; 84/622; 84/623; 84/627; 84/659; 84/661; 84/663; 84/665

[58] Field of Search ..................... 84/601–604, 622–626, 84/633, 659–661, 662, 665, DIG. 9, 627, 663

[56] References Cited

U.S. PATENT DOCUMENTS

| | | | |
|---|---|---|---|
| 5,300,724 | 4/1994 | Medovich | 84/604 |
| 5,686,683 | 11/1997 | Freed | 84/625 |
| 5,744,742 | 4/1998 | Lindemann et al. | 84/623 |

*Primary Examiner*—Robert E. Nappi
*Assistant Examiner*—Marlon T. Fletcher

[57] ABSTRACT

The present invention describes methods and means for estimating the time-varying spectrum of an audio signal based on a conditional probability density function (PDF) of spectral coding vectors conditioned on pitch and loudness values. Using this PDF a time-varying output spectrum is generated as a function of time-varying pitch and loudness sequences arriving from an electronic music instrument controller. The time-varying output spectrum is converted to a synthesized output audio signal. The pitch and loudness sequences may also be derived from analysis of an input audio signal. Methods and means for synthesizing an output audio signal in response to an input audio signal are also described in which the time-varying spectrum of an input audio signal is estimated based on a conditional probability density function (PDF) of input spectral coding vectors conditioned on input pitch and loudness values. A residual time-varying input spectrum is generated based on the difference between the estimated input spectrum and the "true" input spectrum. The residual input spectrum is then incorporated into the synthesis of the output audio signal. A further embodiment is described in which the input and output spectral coding vectors are made up of indices in vector quantization spectrum codebooks.

50 Claims, 11 Drawing Sheets

AUDIO SIGNAL SYNTHESIS SYSTEM BASED ON PROBABILISTIC ESTIMATION OF TIME-VARYING SPECTRA

CROSS-REFERENCE TO RELATED APPLICATIONS

Title: System for Encoding and Synthesizing Tonal Audio Signals
Inventor: Eric Lindemann
Filing Date: May 6, 1999
U.S. PTO Application Number: 09/306,256

FIELD OF THE INVENTION

This invention relates to synthesizing audio signals based on probabilistic estimation of time-varying spectra.

BACKGROUND OF INVENTION

A difficult problem in audio signal synthesis, especially synthesis of musical instrument sounds, is modeling the time-varying spectrum of the synthesized audio signal. The spectrum generally changes with pitch and loudness. In the present invention, we describe methods and means for estimating the time-varying spectrum of an audio signal based on a conditional probability density function (PDF) of spectral coding vectors conditioned on pitch and loudness values. We also describe methods and means for synthesizing an output audio signal in response to an input audio signal by estimating a time-varying input spectrum based on a conditional PDF of input spectral coding vectors conditioned on input pitch and loudness values and for deriving a residual spectrum based on the difference between the estimated spectrum and the "true" spectrum of the input signal. The residual spectrum is then incorporated into the synthesis of the output audio signal.

In *Continuous Probabilistic Transform for Voice Conversion*, IEEE Transactions on Speech and Audio Processing, Volume 6 Number 2, March 1988, by Stylianou et al., a system for transforming a human voice recording so that it sounds like a different voice is described, in which a voiced speech signal is coded using time-varying harmonic amplitudes. A cross-covariance matrix of harmonic amplitudes is used to describe the relationship between the original voice spectrum and desired transformed voice spectrum. This cross-covariance matrix is used to transform the original harmonic amplitudes into new harmonic amplitudes. To generate the cross-covariance matrix speech recordings are collected for the original and transformed voice spectra. For example, if the object is to transform a male voice into a female voice then a number of phrases are recorded of a male and a female speaker uttering the same phrases. The recorded phrases are time-aligned and converted to harmonic amplitudes. Cross-correlations are computed between the male and female utterances of the same phrase. This is used to generate the cross-covariance matrix that provides a map from the male to the female spectra. The present invention is oriented more towards musical instrument sounds where the spectrum is correlated with pitch and loudness. This specification describes methods and means of transforming an input to an output spectrum without deriving a cross-covariance matrix. This is important since it means that time-aligned utterances of the same phrases do not need to be gathered.

U.S. Pat. No. 5,744,742, to Lindemann et al., teaches a music synthesis system wherein during a sustain portion of the tone, amplitude levels of an input amplitude envelope are used to select filter coefficient sets in a sustain codebook of filter coefficient sets arranged according to amplitude. The sustain codebook is selected from a collection of sustain codebooks according to the initial pitch of the tone. Interpolation between adjacent filter coefficient sets in the selected codebook is implemented as a function of particular amplitude envelope values. This system suffers from a lack of responsiveness of spectrum changes due to continuous changes in pitch since the codebook is selected according to initial pitch only. Also, the ad-hoc interpolation between adjacent filter coefficient sets is not based on a solid PDF model and so is particularly vulnerable to spectrum outliers and does not take into consideration the variance of filter coefficient sets associated with a particular pitch and amplitude level. Nor does the system consider the residual spectrum related to incorrect estimates of spectrum from pitch and amplitude. These defects in the system make it difficult to model rapidly changing spectra as a function of pitch and loudness, and so restrict the use of the system to sustain portions of a tone only. The attack and release portion of the tone are modeled by deterministic sequences of filter coefficients that do not respond to instantaneous pitch and loudness.

BRIEF SUMMARY OF THE INVENTION

Accordingly, one object of the present invention is to estimate the time-varying spectrum of a synthesized audio signal as a function of a conditional probability density function (PDF) of spectral coding vectors conditioned on time-varying pitch and loudness values. The goal is to generate an expressive natural sounding time-varying spectrum based on pitch and loudness variations. The pitch and loudness sequences are generated from an electronic music controller or as the result of analysis of an input audio signal.

The conditional PDF of spectral coding vectors conditioned on pitch and loudness values is generated from analysis of audio signals. These analysis audio signals are selected to be representative of the type of signals we wish to synthesize. For example, if we wish to synthesize the sound of a clarinet, then we typically provide a collection of recordings of idiomatic clarinet phrases for analysis. These phrases span the range of pitch and loudness appropriate to the clarinet. We describe methods and means for performing the analysis of these audio signals later in this specification.

Another object of the present invention is to synthesize an output audio signal in response to an input audio signal. The goal is to modify the pitch and loudness of the input audio signal while preserving a natural spectrum or, alternatively, to modify or "morph" the spectrum of the input audio signal to take on characteristics of a different instrument or voice. In this case, the invention involves estimating the most probable time-varying spectrum of the input audio signal given its time-varying pitch and loudness. The "true" time-varying spectrum of the input audio signal is also estimated directly from the input audio signal. The difference between the most probable time-varying input spectrum and the true time-varying input spectrum forms a residual time-varying input spectrum. Output pitch and loudness sequences are derived by modifying the input pitch and loudness sequences. A mean time-varying output spectrum is estimated based on a conditional PDF of output time-varying spectra conditioned on output pitch and loudness. The residual time-varying input spectrum is transformed to form a residual time-varying output spectrum. The residual time-varying output spectrum is combined with the mean time-varying output spectrum to form the final time-varying output spectrum. The final time-varying output spectrum is converted into the output audio signal.

To modify pitch and loudness of the input audio signal while preserving natural sounding time-varying spectra, the input conditional PDF and the output conditional PDF are the same, so that changes in pitch and loudness result in estimated output spectra appropriate to the new pitch and loudness values. To modify or "morph" the spectrum of the input signal, the input conditional PDF and the output conditional PDF are different, perhaps corresponding to different musical instruments.

In still another embodiment of the present invention the input and output spectral coding vectors are made up of indices in vector quantization spectrum codebooks. This allows for reduced computation and memory usage while maintaining good audio quality.

DESCRIPTION OF PREFERRED EMBODIMENTS

Figure 1:
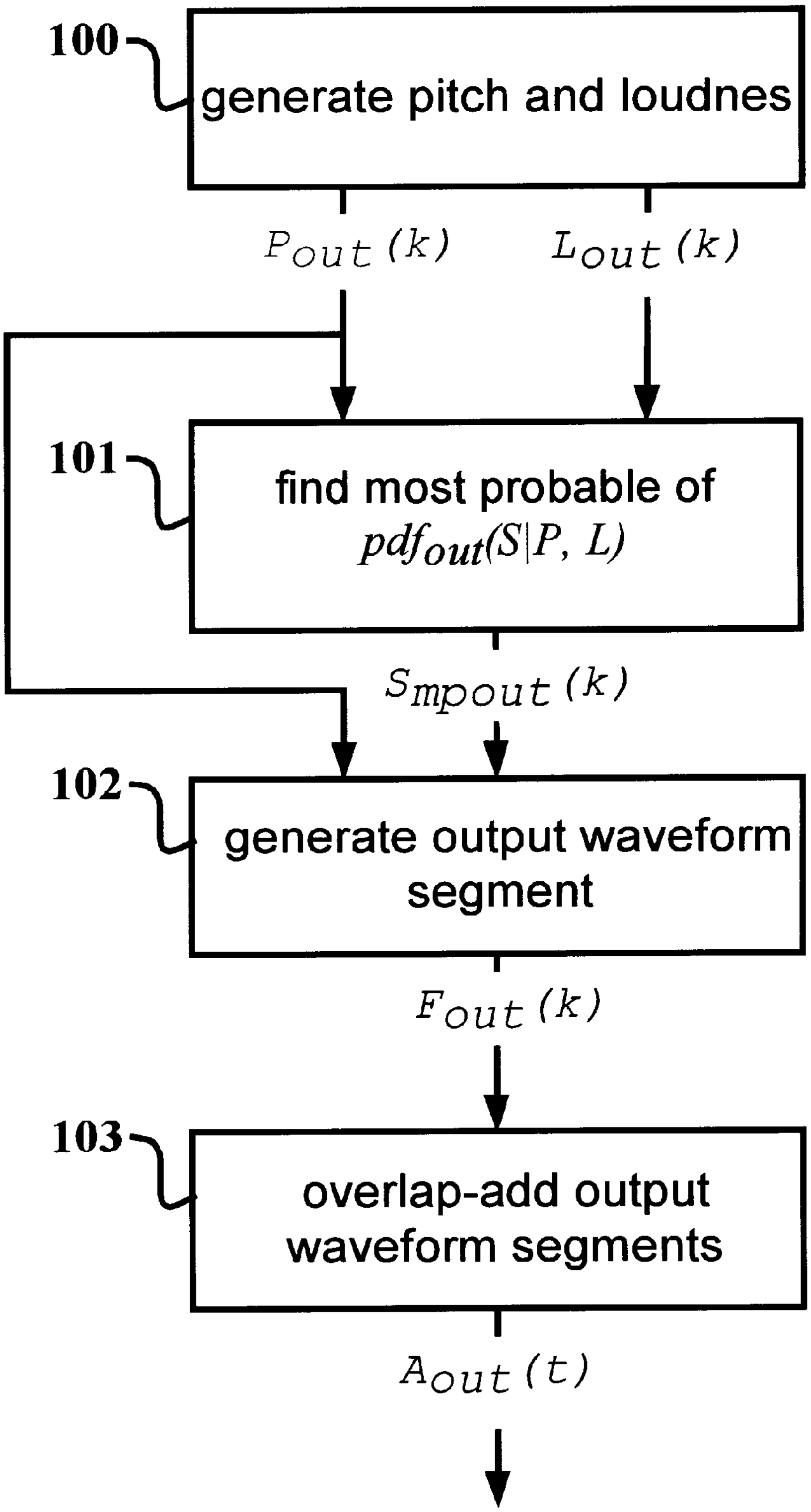
FIG. 1—audio signal synthesis system based on estimation of a sequence of output spectral coding vectors from a known sequence of pitch and loudness values.

FIG. 1 shows a block diagram of the audio signal synthesizer according to the present invention. In 100, a time-varying sequence of output pitch values and a time-varying sequence of output loudness values are generated. $P_{out}(k)$ refers to the kth pitch value in the pitch sequence and $L_{out}(k)$ refers to the kth loudness value in the loudness sequence. k is in units of audio frame length FLEN. In the embodiment of FIG. 1, FLEN is approximately twenty milliseconds and is the same for all audio frames. However, in general, the exact value of FLEN is unimportant and may even vary from frame to frame.

Figure 2:
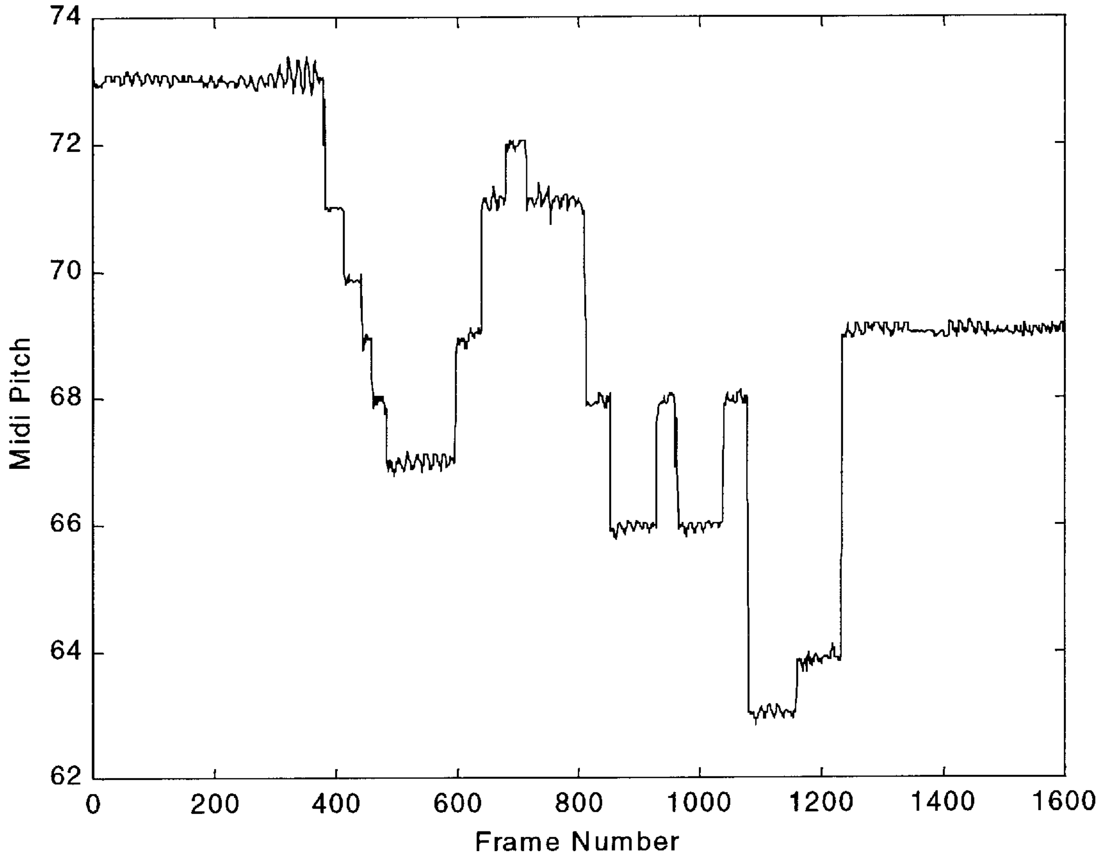
FIG. 2—typical sequence of time-varying pitch values.

FIG. 2 shows a plot of typical $P_{out}(k)$ for all k. The pitch values are in units of MIDI pitch where A440 corresponds to Midi pitch 60 and each integer step is a musical half step. In the present embodiment, fractional MIDI pitch values are permitted. The $P_{out}(k)$ reflect changes from one musical pitch to the next—e.g. from middle C to D one step higher-and also smaller fluctuations around a central pitch—e.g. vibrato fluctuations.

Figure 3:
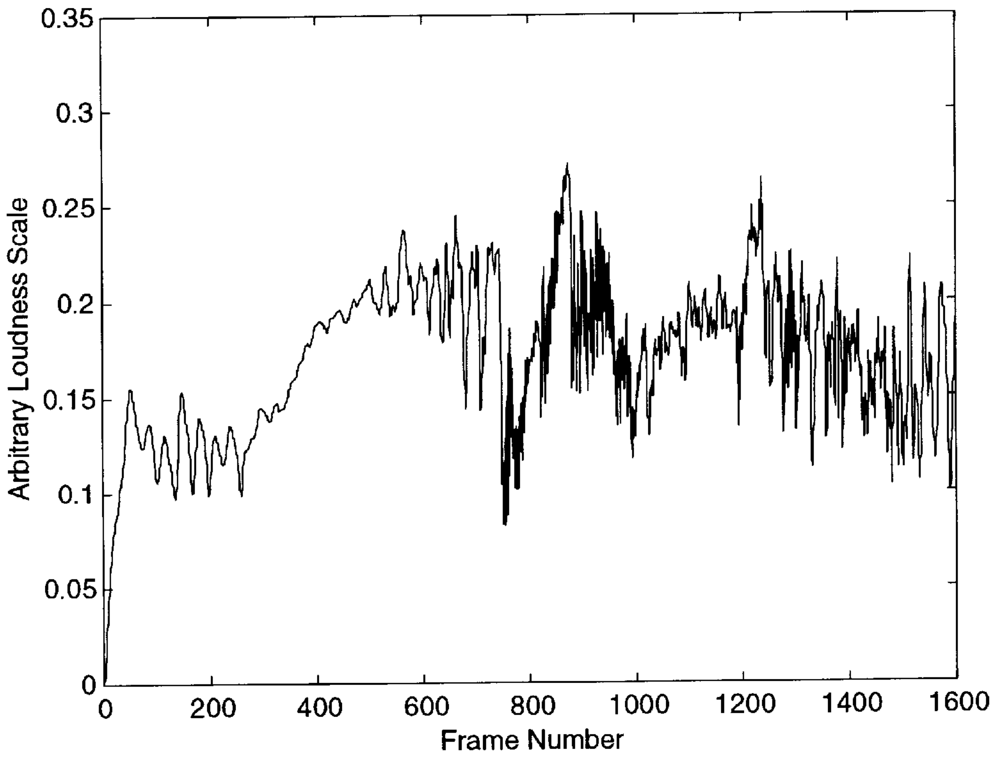
FIG. 3—typical sequence of time-varying loudness values.

FIG. 3 shows a plot of typical $L_{out}(k)$ for all k. The loudness scale is arbitrary bus is intended to reflect changes in relative perceived loudness on a linear scale—i.e. doubling in perceived loudness corresponds to doubling of the loudness value. In the present embodiment, the loudness of an audio segment is computed using the method described by Moore, Glasberg, and Baer in *A Model for the Prediction of Thresholds, Loudness and Partial Loudness*, Journal of the Audio Engineering Society, Vol. 45, No. 4, April 1997. Other quantities that are strongly correlated with loudness, such as time-varying power, amplitude, log power, or log amplitude, may also be used in place of the time-varying loudness values without changing the essential character of the present invention.

In the present invention we assume a non-zero correlation between the sequences $P_{out}(k)$ and $L_{out}(k)$ on the one hand and a sequence of output spectral coding vectors on the other. $S_{out}(k)$ refers to the kth vector in the sequence of output spectral coding vectors. The $S_{out}(k)$ describe the time-varying spectral characteristics of the output audio signal $A_{out}(t)$. This correlation permits some degree of predictability of the $S_{out}(k)$ given the $P_{out}(k)$ and the $L_{out}(k)$. In general, this predictability is reflected in a conditional probability density function (PDF) of sequences of output spectral coding vectors given a sequence of output pitch and loudness values. However, in the embodiment of FIG. 1, we assume that a particular $S_{out}(k)$ depends only on the corresponding $P_{out}(k)$ and $L_{out}(k)$—e.g. $S_{out}$(135) from audio frame 135 depends only on $P_{out}$(135) and $L_{out}$(135) from the same audio frame. $pdf_{out}(S|P,L)$ gives the conditional PDF of output spectral coding vectors given a particular pitch P and loudness L. In 101, for every frame k, the most probable spectral coding vector $S_{mpout}(k)$ is determined as the output spectral coding vector that maximizes $pdf_{out}(S|P,L)$ given $P_{out}(k)$ and $L_{out}(k)$.

In 102, $S_{mpout}(k)$ is converted to an output waveform segment $F_{out}(k)$. Also in 102, the pitch of $F_{out}(k)$ is adjusted to match $P_{out}(k)$. The method used to make the conversion from $S_{mpout}(k)$ to $F_{out}(k)$ with adjusted pitch $P_{out}(k)$ depends, in part, on the type of spectral coding vector used. This will be discussed below. In 103, $F_{out}(k)$ is overlap-added with the tail of $F_{out}(k-1)$. In this way a continuous output audio signal $A_{out}(t)$ is generated. In another embodiment, the $F_{out}(k)$ are not overlap-added but simply concatenated to generate $A_{out}(t)$.

Figure 4:
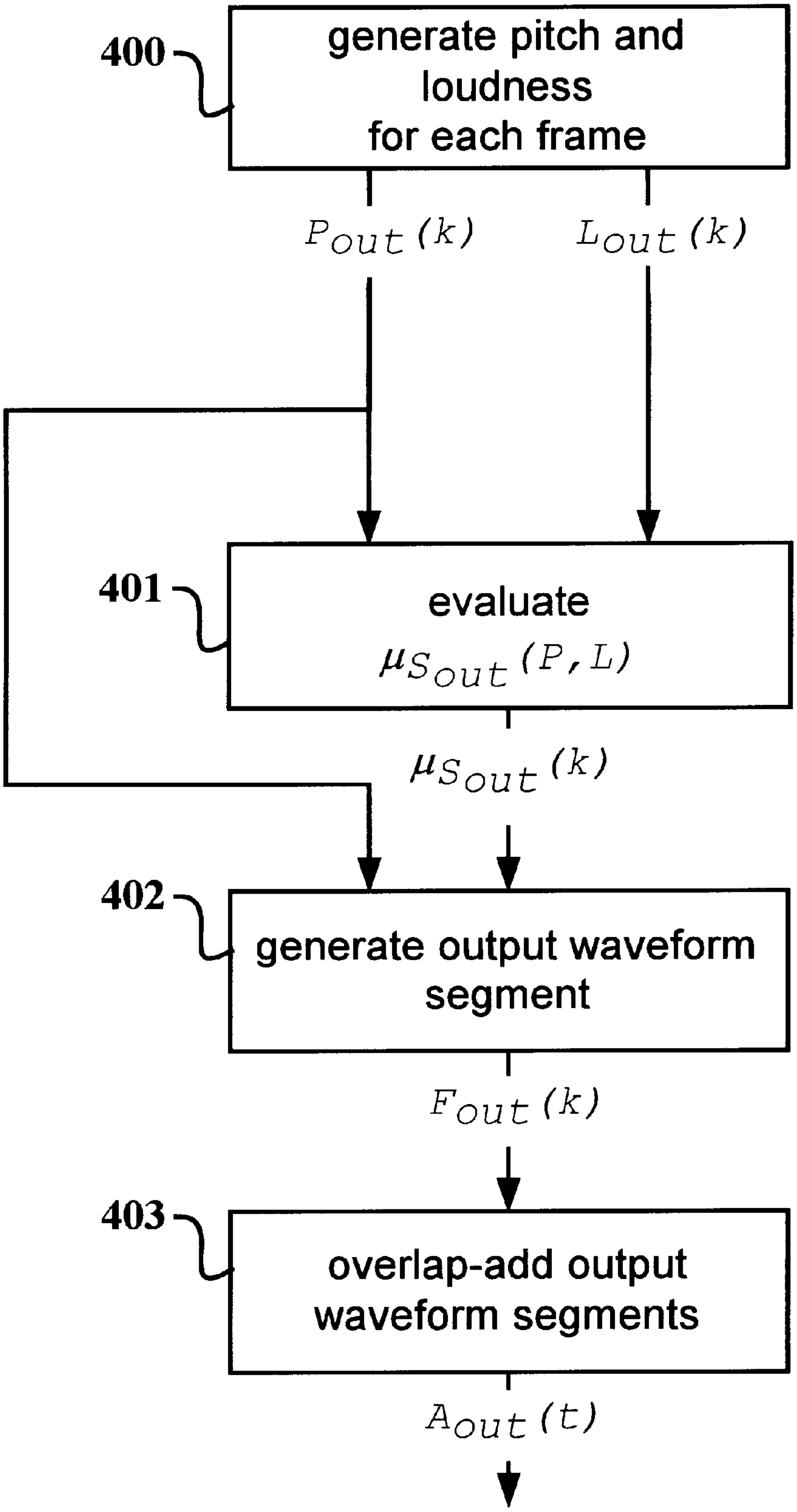
FIG. 4—audio signal synthesis system similar to FIG. 1 but where the estimation of output spectral coding vectors is based on finding the mean value of the conditional PDF of output spectral coding vectors conditioned on pitch and loudness.

FIG. 4 shows a block diagram of another embodiment of an audio signal synthesizer similar to FIG. 1. In FIG. 4, for a given $P_{out}(k)$ and $L_{out}(k)$, we assume $pdf_{out}(S|P,L)$ can be modeled with a multivariate Gaussian conditional PDF characterized entirely by mean spectral coding vector and covariance matrix. Since $pdf_{out}(S|P,L)$ is Gaussian, for a given $P_{out}(k)$ and $L_{out}(k)$ the most probable output spectral coding vector is the conditional mean $\mu_{S_{out}}(k)$ returned by the function $\mu_{S_{out}}(P,L)$. In 401, $\mu_{S_{out}}(P,L)$ is evaluated to return $\mu_{S_{out}}$(k). In 402, $\mu_{S_{out}}$(k) is converted to an output waveform segment $F_{out}$(k) with pitch $P_{out}$(k) just as in 102 of FIG. 1. In 403, $F_{out}$(k) is overlap-added, as in 103 of FIG. 1, to generate $A_{out}$(t).

Figure 9:
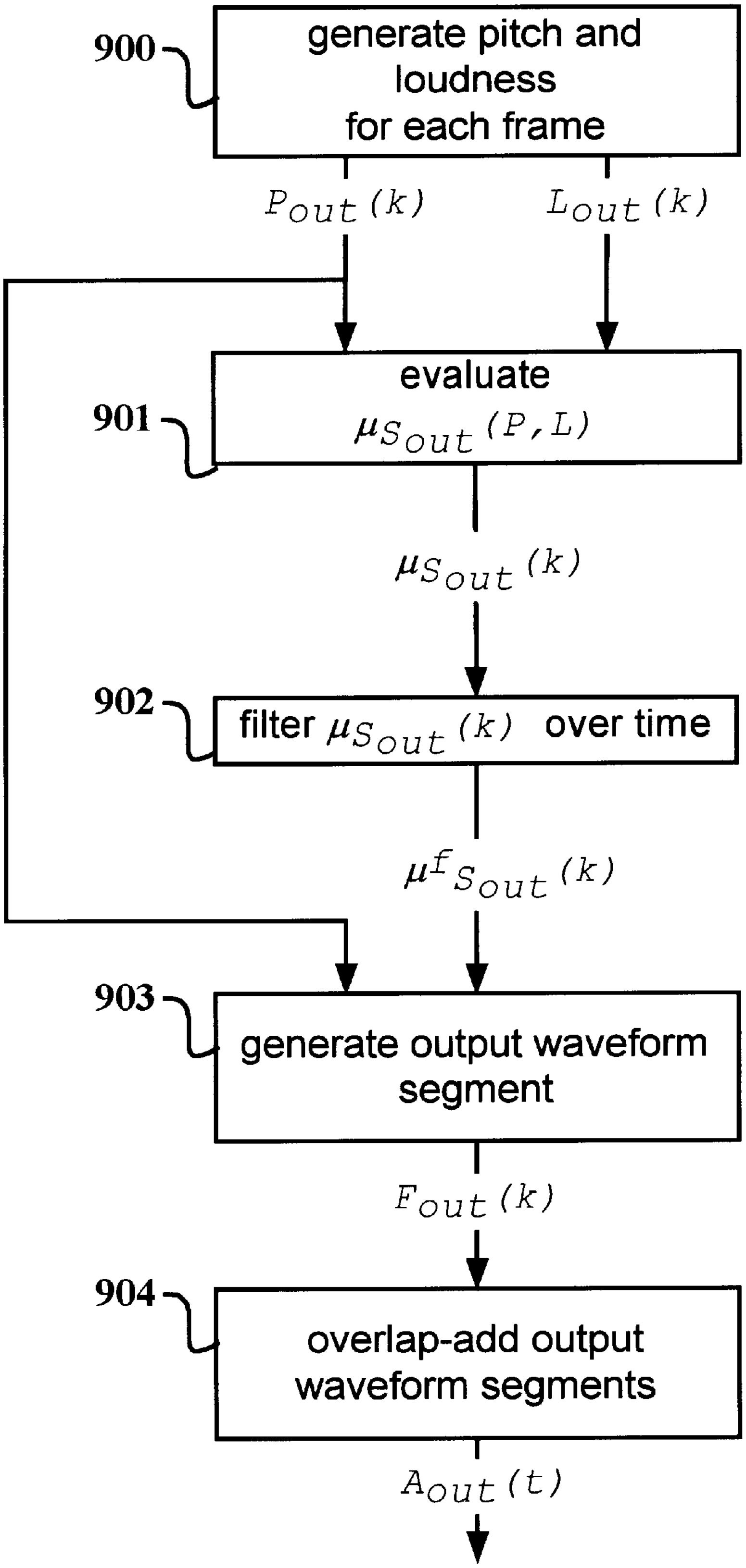
FIG. 9—audio signal synthesis system similar to FIG. 4 wherein the sequence of output spectral coding vectors is filtered over time.

In another embodiment of the present invention the $\mu_{S_{out}}$(k) are filtered over time, with filters having impulse responses that reflect the autocorrelation of elements of the $\mu_{S_{out}}$(k) sequence of vectors. Correlation between spectral coding vectors over time, between elements within a spectral coding vector, and between $P_{out}$(k),$L_{out}$(k) and $\mu_{S_{out}}$(k) can be accounted for with multivariate filters of varying complexity. FIG. 9 shows a block diagram of this embodiment where filtering of $\mu_{S_{out}}$(k) is accomplished in 902, and a filtered sequence of output spectral coding vectors $\mu^f_{S_{out}}$(k) is formed. We will not describe this kind of embodiment further in this specification, but we will assume that the embodiments described below can have this filtering feature added as an enhancement.

There are many types of spectral coding vector that can be used in the present invention, and the conversion from spectral coding vector to time-domain waveform segment $F_{out}$(k) with adjusted pitch $P_{out}$(k) depends in part on the specific spectral coding vector type.

In one embodiment each spectral coding vector $S_{out}$(k) comprises frequencies, amplitudes, and phases of a set of sinusoids. The frequency values may be absolute, in which case $P_{out}$(k) serves no function in establishing the pitch of the output segment $F_{out}$(k). Alternatively, $P_{out}$(k) may correspond to a time-varying fundamental frequency $f_0$(k), and the sinusoidal frequencies in each vector $S_{out}$(k) may specify multiples of $f_0$(k). $P_{out}$(k) is generally in units of Midi pitch. Conversion to frequency in Hertz is accomplished with the formula $f_0(k)=2^{((P_{out}(k)-69)/12)}*440$, where 69 is the MIDI pitch value corresponding to a frequency of 440 Hz.

Generating the time domain waveform $F_{out}$(k) involves summing the output of a sinusoidal oscillator bank whose frequencies, amplitudes, and phases are given by $S_{out}$(k), with $P_{out}$(k) corresponding to a possible fundamental frequency $f_0$(k). Alternatively, the sinusoidal oscillator bank can be implemented using inverse Fourier transform techniques. These techniques are well understood by those skilled in the art of sinusoidal synthesis.

In another closely related embodiment, each spectral coding vector comprises amplitudes and phases of a set of harmonically related sinusoid components. This is similar to the embodiment above except that the frequency components are implicitly understood to be the consecutive integer multiples—1,2,3, . . . —of the fundamental frequency $f_0$(k) corresponding to $P_{out}$(k). Generating the time-domain waveform $F_{out}$(k) can be accomplished using the sinusoidal oscillator bank or inverse Fourier transform techniques described above.

In another embodiment each spectral coding vector $S_{out}$(k) comprises amplitude spectrum values across frequency—e.g. absolute value of FFT spectrum for an audio frame of predetermined length. In this case the spectral coding vector is treated as the frequency response of a filter. This frequency response is used to shape the spectrum of a pulse train, multi-pulse signal, or sum of sinusoids with equal amplitudes but varying phases. These signals have initially flat spectra and are pitch shifted to $P_{out}$(k) before spectral shaping by $S_{out}$(k). The pitch shifting can be accomplished with sample rate conversion techniques that do not distort the flat spectrum assuming appropriate band-limiting is applied before resampling. The spectral shaping can be accomplished with a frequency domain or time-domain filter. These filtering and sample rate conversion techniques are well understood by those skilled in the art of digital signal processing and sample rate conversion.

In another embodiment each vector $S_{out}$(k) corresponds to a log amplitude spectrum. In still another embodiment each vector $S_{out}$(k) corresponds to a series of cepstrum values. Both of these spectral representations can be used to describe a spectrum-shaping filter that can be used as described above. These spectral coding vector types, and methods for generating them, are well understood by those skilled in the art of spectral coding of audio signals.

In a related invention, U.S. Utility patent application Ser. No. 09/306,256, to Lindemann, the present inventor teaches a preferred type of spectral coding vector. This type is summarized below. However, the essential character of the present invention is not affected by the choice of spectral coding vector type.

Some of the spectral coding vector types described above include phase values. Since the human ear is not particularly sensitive to phase relationships between spectral components, the phase values can often be omitted and replaced by suitably generated random phase components, provided the phase components maintain frame-to-frame continuity. These considerations of phase continuity are well understood by those skilled in the art of audio signal synthesis.

The conditional mean function $\mu_{S_{out}}$(P,L) in 401 of FIG. 4 returns the conditional mean $\mu_{S_{out}}$(k) of $pdf_{out}$(S|P,L) given particular values $P_{out}$(k) and $L_{out}$(k). A similar function that will be used in further embodiments is the conditional covariance function that returns the covariance matrix $\Sigma_{S_{out}S_{out}}$(k) of $pdf_{out}$(S|P,L) given particular values $P_{out}$(k) and $L_{out}$(k). This function is referred to as $\Sigma_{S_{out}S_{out}}$(P,L).

Figure 5:
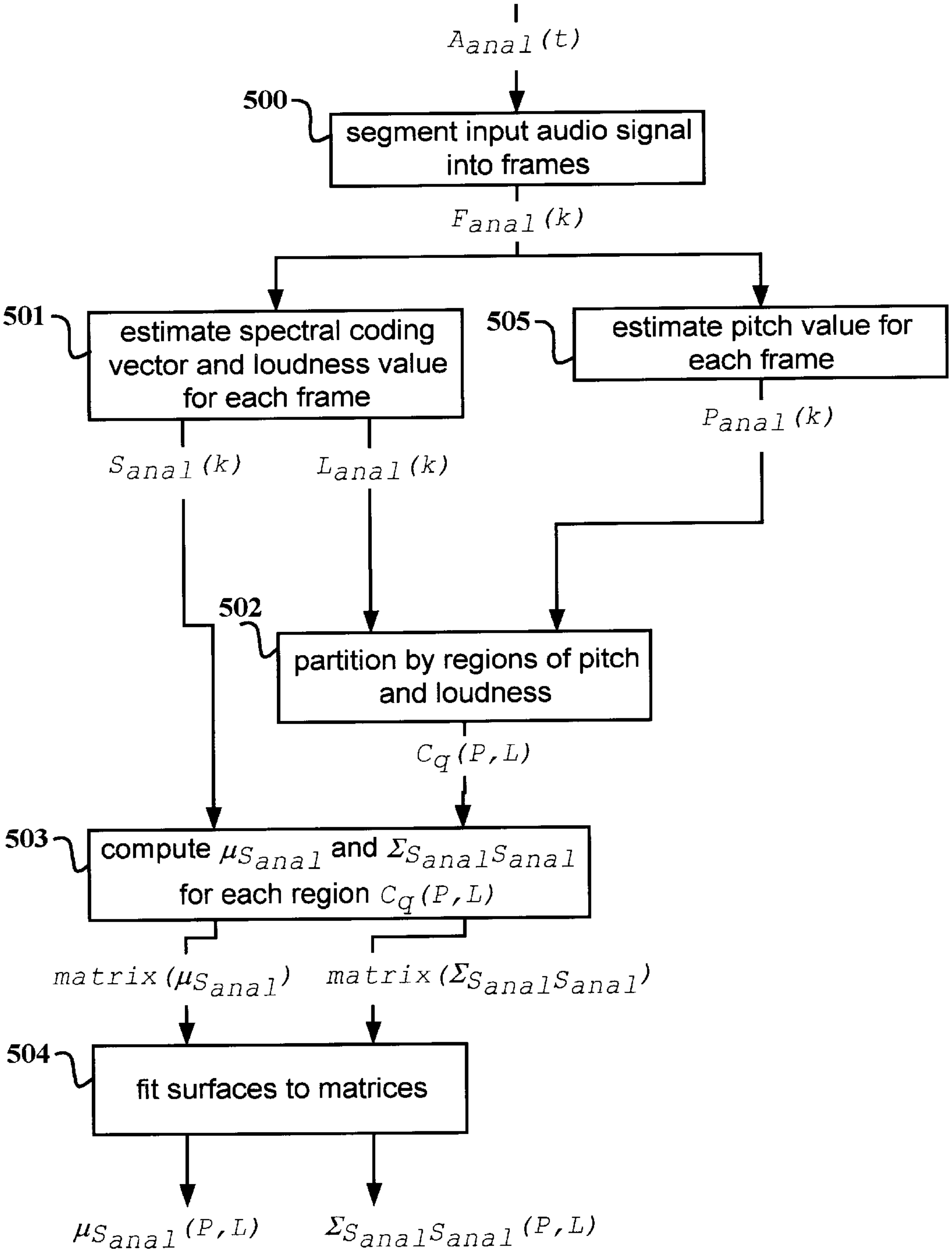
FIG. 5—audio signal analysis system used to generate functions of pitch and loudness that return mean spectral coding vector and spectrum covariance matrix estimates given particular values of pitch and loudness.

Conditional mean function $\mu_{S_{out}}$(P,L) and conditional covariance function $\Sigma_{S_{out}S_{out}}$(P,L) are based on analysis data. FIG. 5 shows a block diagram of one embodiment of the analysis process that leads to $\mu_{S_{out}}$(P,L) and $\Sigma_{S_{out}S_{out}}$(P,L). In FIG. 5 the subscript "anal" is used instead of "out". This is for generality since, as will be seen, the process of FIG. 5 is used to generate mean and covariance statistics for input and output signals.

In 500, an audio signal to be analyzed $A_{anal}$(t) is segmented into a sequence of analysis audio frames $F_{anal}$(k). In 501, each $F_{anal}$(k) is converted to an analysis spectral coding vector $S_{anal}$(k) and a loudness value $L_{anal}$(k) is generated based on the spectral coding vector. In 505, an analysis pitch value $P_{anal}$(k) is generated for each $F_{anal}$(k).

$A_{anal}$(t) is selected to represent the time-varying spectral characteristics of the output audio signal $A_{out}$(t) to be synthesized. $A_{anal}$(t) covers a desired range of pitch and loudness for $A_{out}$(t). For example, if $A_{out}$(t) is to sound like a clarinet then $A_{anal}$(t) will correspond to a recording, or a concatenation of several recordings, of clarinet phrases covering a representative range of pitch and loudness.

In 502, the pitch and loudness ranges of $P_{anal}$(k) and $L_{anal}$(k) are quantized into a discrete number of pitch-loudness regions $C_q$(p,l), where p refers to the pth quantized pitch step and l refers to the lth quantized loudness step. Specific pitch and loudness values $P_{anal}$(k) and $L_{anal}$(k) are said to be contained in the region $C_q$(p,l) if $P_{anal}$(k) is greater than or equal to the value of the pth quantized pitch step and less than the value of the (p+1)th quantized pitch step, and $L_{anal}$(k) is greater than or equal to the loudness value of the lth quantized loudness step and less than the loudness value of the (l+1)th quantized loudness step.

In 503, the vectors $S_{anal}$(k) are partitioned by pitch-loudness regions $C_q$(p,l). This is accomplished by assigning each vector $S_{anal}(k)$ to the pitch-loudness region $C_q(p,l)$ that contains the corresponding $P_{anal}(k)$ and $L_{anal}(k)$. So for each region $C_q(p,l)$ there is a corresponding data set comprised of spectral coding vectors from $S_{anal}(k)$ whose corresponding $P_{anal}(k)$ and $L_{anal}(k)$ are contained in the region $C_q(p,l)$.

For each region $C_q(p,l)$ the mean spectral coding vector $\mu_{S_{anal}}(p,l)$ is estimated as the sample mean of the spectral coding vector data set associated with that region. The sample mean estimates $\mu_{S_{anal}}(p,l)$ are inserted into matrix $(\mu_{S_{anal}})$. In this matrix p selects the row position and l selects the column position so each matrix location corresponds to a pitch loudness region $C_q(p,l)$. Each location in matrix $(\mu_{S_{anal}})$ contains the mean spectral coding vector $\mu_{S_{anal}}(p,l)$ associated with the region $C_q(p,l)$. As such, matrix$(\mu_{S_{anal}})$ is a matrix of mean spectral coding vectors.

Likewise, for each region $C_q(p,l)$, the covariance matrix $\Sigma_{S_{anal}S_{anal}}(p,l)$ is estimated as the sample covariance matrix of the data set associated with that region. The sample covariance matrix estimates $\Sigma_{S_{anal}S_{anal}}(p,l)$ are inserted into matrix $(\Sigma_{S_{anal}S_{anal}})$ where again p selects the row position and l selects the column position. Each location in matrix$(\Sigma_{S_{anal}S_{anal}})$ contains the covariance matrix $\Sigma_{S_{anal}S_{anal}}(p,l)$ associated with the region $C_q(p,l)$. As such, matrix$(\Sigma_{S_{anal}S_{anal}})$ is a matrix of covariance matrices.

The input audio signal $A_{anal}(t)$ is typically taken from recordings of idiomatic phrases—e.g. from a musical instrument performance. As such, pitches and loudness levels are not uniformly distributed. Some entries in matrix$(\mu_{S_{anal}})$ and matrix$(\Sigma_{S_{anal}S_{anal}})$ will be based on data sets containing many $S_{anal}(k)$ vectors. Others will be based on data sets containing only a few $S_{anal}(k)$ vectors. The greater the number of $S_{anal}(k)$ vectors in the data set associated with region $C_q(p,l)$, the more confident the estimates of $\mu_{S_{anal}}(p,l)$ and $\Sigma_{S_{anal}S_{anal}}(p,l)$. For still other locations there will be no $S_{anal}(k)$ vectors and so no estimates. So after analysis, matrix$(\mu_{S_{anal}})$ and matrix$(\Sigma_{S_{anal}S_{anal}})$ may be incompletely or even sparsely filled and, where filled, estimates will have different confidence levels associated with them.

In 504, the matrices matrix$(\mu_{S_{anal}})$ and matrix$(\Sigma_{S_{anal}S_{anal}})$ are used to generate functions $\mu_{S_{anal}}(P,L)$ and $\rho_{S_{anal}S_{anal}}(P,L)$. Note that while $\mu_{S_{anal}}(p,l)$ refers to the mean spectral coding vector associated with region $C_q(p,l)$, the function $\mu_{S_{anal}}(P,L)$ refers to a function that returns a mean spectral coding vector estimate for any arbitrary pitch and loudness values (P,L). Likewise, $\Sigma_{S_{anal}S_{anal}}(p,l)$ refers to the covariance matrix associated with region $C_q(p,l)$, and function $\Sigma_{S_{anal}S_{anal}}(P,L)$ refers to a function that returns a covariance matrix estimate for any arbitrary pitch and loudness values (P,L).

The functions $\mu_{S_{anal}}(P,L)$ and $\Sigma_{S_{anal}S_{anal}}(P,L)$ account for the uneven filling of matrix$(\mu_{S_{anal}})$ and matrix$(\Sigma_{S_{anal}S_{anal}})$ and provide consistent estimates for all pitch and loudness values (P,L).

A particular element of the mean spectral coding vector—e.g. the $3^{rd}$ element of the vector—has different values for each mean spectral coding vector in matrix$(\mu_{S_{anal}})$. These values can be interpreted as points at differing heights above a two-dimensional pitch-loudness plane. In 504, a smooth non-linear surface is fit through these points. There is one surface associated with each element in the mean spectral coding vector. To obtain the estimate $\mu_{S_{anal}}(k)$ given values $P_{anal}(k)$ and $L_{anal}(k)$, the function $\mu_{S_{anal}}(P,L)$ determines the location (p,l) on the pitch-loudness plane corresponding to pitch and loudness values $P_{anal}(k)$ and $L_{anal}(k)$. The function $\mu_{S_{anal}}(P,L)$ then determines the height above location (p,l) for the surface associated with each element of the mean vector. These heights correspond to the elements of $\mu_{S_{anal}}(k)$.

In a similar manner, a particular element of the spectrum covariance matrix—e.g. the element at row 2 column 3 in the spectrum covariance matrix—has different values for each spectrum covariance matrix in matrix$(\Sigma_{S_{anal}S_{anal}})$. These values can be interpreted as points at differing heights above a two-dimensional pitch-loudness plane. In 504, a smooth non-linear surface is fit through these points. There is one surface associated with each element in the spectrum covariance matrix. To obtain the estimate $\Sigma_{S_{anal}S_{anal}}(k)$ given values $P_{anal}(k)$ and $L_{anal}(k)$, the function $\Sigma_{S_{anal}S_{anal}}(P,L)$ determines the location (p,l) on the pitch-loudness plane corresponding to pitch and loudness values $P_{anal}(k)$ and $L_{anal}(k)$. The function $\Sigma_{S_{anal}S_{anal}}(P,L)$ then determines the height above location (p,l) for the surface associated with each element of the spectrum covariance matrix. These heights correspond to the elements of $\Sigma_{S_{anal}S_{anal}}(k)$.

In one embodiment of 504, each surface is fit using a two-dimensional spline function. The number of spectral coding vectors from $S_{anal}(k)$ included in the data set associated with region $C_q(p,l)$ is used to weight the importance of that data set in the spline function fit. If there are no data set elements for a particular region $C_q(p,l)$ than a smooth spline interpolation is made over the corresponding location (p,l). Other types of interpolating functions—e.g. polynomial functions and linear interpolation functions—can be used to fit these surfaces. The particular form of interpolating function does not affect the basic character of the present invention.

In the discussion above, regions $C_q(p,l)$ form a hard non-overlapping partition of pitch and loudness space. In another embodiment the regions do overlap. This means that the $S_{anal}(k)$ data set vectors used to estimate $\mu_{S_{anal}}(p,l)$ and $\Sigma_{S_{anal}S_{anal}}(p,l)$ for a particular region $C_q(p,l)$ may have some vectors in common with the $S_{anal}(k)$ data set vectors used to make estimates for adjacent regions. The contribution of each $S_{anal}(k)$ vector to an estimate can also be weighted according to its proximity to the center of the region $C_q(p,l)$. This overlapping helps to reduce the unevenness in filling matrices matrix$(\mu_{S_{anal}})$ and matrix$(\Sigma_{S_{anal}S_{anal}})$.

Figure 6:
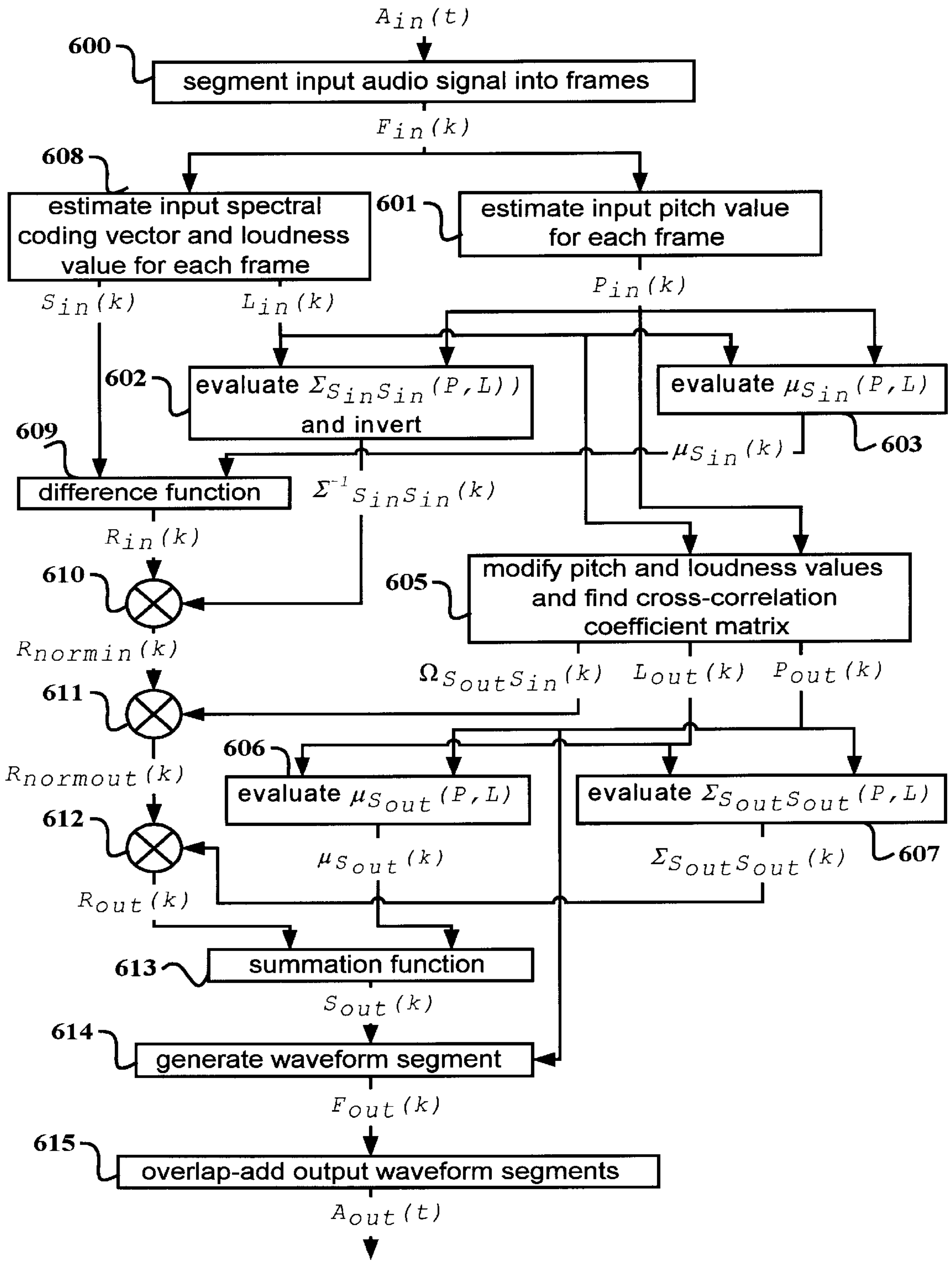
FIG. 6—audio signal synthesis system responsive to an input audio signal, wherein a time-varying residual input spectrum is combined with an estimation of a time-varying output spectrum based on pitch and loudness to produce a final time-varying output spectrum.

FIG. 6 shows a further embodiment of the present invention in which the synthesis of the output audio signal $A_{out}(t)$ is responsive to an input audio signal $A_{in}(t)$. In 600, the audio input signal $A_{in}(t)$ is segmented into frames $F_{in}(k)$. In 608, an input spectral coding vector $S_{in}(k)$ and a loudness value $L_{in}(k)$ are estimated from $F_{in}(k)$ for every frame. In 601, a pitch value $P_{in}(k)$ is estimated for each $F_{in}(k)$. In 602, the function $\Sigma_{S_{in}S_{in}}(P,L)$ is evaluated for each frame given $P_{in}(k)$ and $L_{in}(k)$ and the resulting matrix is inverted to return the $\Sigma^{-1}_{S_{in}S_{in}}(k)$. In 603, the function $\mu_{S_{in}}(P,L)$ is evaluated for each frame given $P_{in}(k)$ and $L_{in}(k)$ and $\mu_{S_{in}}(k)$ is returned. The functions $\Sigma_{S_{in}S_{in}}(P,L))$ and $\mu_{S_{in}}(P,L)$ are generated using the same analysis techniques described in connection with FIG. 5.

In 605, $P_{in}(k)$ and $L_{in}(k)$ are modified to form $P_{out}(k)$ and $L_{out}(k)$. A typical modification may consist of adding a constant value to $P_{in}(k)$. This corresponds to pitch transposition. The modification may also consist of adding a time-varying value to $P_{in}(k)$. This corresponds to time-varying pitch transposition. The modification may also consist of multiplying $L_{in}(k)$ by a constant or time-varying sequence of values. Values can also be added to $L_{in}(k)$. The character of the present invention does not depend on the particular modification of pitch and loudness employed. Also in 605, the matrix of cross-correlation coefficients $\Omega_{S_{out}S_{in}}(k)$ is generated for every frame. We will discuss this below.

In 606 and 607 the functions $\mu_{S_{out}}(P,L)$ and $\Sigma_{S_{out}S_{out}}(P,L)$ are evaluated to return the $\mu_{S_{out}}(k)$ and $\Sigma_{S_{out}S_{out}}(k)$ estimates for every frame. The functions $\mu_{S_{out}}(P,L)$ and $\Sigma_{S_{out}S_{out}}(P,L)$ are generated using the same analysis techniques described in connection with FIG. 5.

We can regard the embodiment of FIG. 6 as a system in which $S_{out}(k)$ is predicted from $S_{in}(k)$ using $\mu_{S_{in}}(k)$, $\Sigma_{S_{in}S_{in}}(k)$, $\Omega_{S_{out}S_{in}}(k)$, $\mu_{S_{out}}(k)$, and $\Sigma_{S_{out}S_{out}}(k)$. A general formula that describes the prediction of an output vector from an input vector given mean vectors and covariance matrices is given by Kay in *Statistical Signal Processing: Estimation Theory*, Prentice Hall, 1993, pp. 324–325, as:

$$S_{out}(k)=\mu_{S_{out}}+\Sigma_{S_{out}\,S_{in}}\Sigma^{-1}{}_{S_{in}S_{in}}(S_{in}(k)-\mu_{S_{in}}) \quad (1)$$

where:

$S_{in}(k)$=input spectral coding vector for frame k $S_{out}(k)$=output spectral coding vector for frame k $\mu_{S_{in}}$=mean value of input spectral coding vectors $\mu_{S_{out}}$=mean value of output spectral coding vectors $\Sigma^{-1}{}_{S_{in}S_{in}}$=inverse of covariance matrix of input spectral coding vector elements $\Sigma_{S_{out}S_{in}}$=cross-covariance matrix between output spectral coding vector elements and input spectral coding vector elements Equation (1) states that if we know the second order statistics-the mean vector and covariance matrix—of the input spectral coding vectors and we know the cross-covariance matrix between the output spectral coding vectors and the input spectral coding vectors, and we know the mean vector of the output spectral coding vectors, we can predict the output spectral coding vectors from the input spectral coding vectors. With the assumption that the probability distributions of the input and output spectral coding vectors are Gaussian, this prediction will correspond to the Minimum Mean Squared Error (MMSE) estimate of the output spectral coding vector given the input spectral coding vector.

In the present invention we factor the cross-covariance matrix estimation into the product of two matrices as follows:

$$\Sigma_{S_{out}S_{in}}=\Sigma_{S_{out}S_{out}}\Omega_{S_{out}S_{in}} \quad (2)$$

where:

$\Sigma_{S_{out}S_{out}}$=out covariance matrix of output spectral coding vectors.

$\Omega_{S_{out}S_{in}}$=matrix of cross-correlation coefficients between output and input spectral coding vectors.

$\Sigma_{S_{out}S_{in}}$=cross-covariance matrix between output and input spectral coding vectors.

Also, in the present invention the estimates of $\mu_{S_{in}}$, $\Sigma^{-1}{}_{S_{in}S_{in}}$, $\mu_{S_{out}}$, and $\Sigma_{S_{out}S_{in}}$ are time-varying since they are functions of $P_x(k)$ and $L_x(k)$ for frame k.

Taking these factors into consideration, we can rewrite equation (1) as:

$$S_{out}(k)=\mu_{S_{out}}(k)+\Sigma_{S_{out}S_{out}}(k)\Omega_{S_{out}S_{in}}(k)\Sigma^{-1}{}_{S_{in}\,S_{in}}(k)(S_{in}(k)-\Sigma_{S_{in}}(k)) \quad (3)$$

The term $(S_{in}(k)-\mu_{S_{in}}(k))$ subtracts the current frame estimate of the mean input spectral coding vector, given pitch and loudness $P_{in}(k)$ and $L_{in}(k)$, from the current frame input spectral coding vector $S_{in}(k)$. This operation is performed in 609 and generates a residual input spectral coding vector $R_{in}(k)$. $R_{in}(k)$ defines the way in which the sequence of input spectral coding vectors $S_{in}(k)$ departs from the most probable sequence of input spectral coding vectors $\mu_{S_{in}}(k)$. We can rewrite equation (3) using $R_{in}(k)$ as:

$$S_{out}(k)=\mu_{S_{out}}(k)+\Sigma_{S_{out}S_{out}}(k)\Omega_{S_{out}S_{in}}(k)\Sigma^{-1}{}_{S_{in}S_{in}}(k)R_{in}(k) \quad (4)$$

In 610, the matrix-vector multiply $\Sigma^{-1}{}_{S_{in}S_{in}}(k)R_{in}(k)$ is performed. This effectively normalizes the residual $R_{in}(k)$ by the input covariance matrix to produce $R_{normin}(k)$ referenced to unit variance for all elements. This forms the normalized residual input spectral coding vector.

The cross-correlation coefficients in matrix $\Omega_{S_{out}S_{in}}(k)$ are values between 0 and 1. These reflect the degree of correlation between all pairs of elements taken from $S_{in}(k)$ and $S_{out}(k)$. In 611, $R_{normin}(k)$ is multiplied by matrix $\Omega_{S_{out}S_{in}}(k)$ to form a normalized residual output spectral coding vector $R_{normout}(k)$. In 612, $R_{normout}(k)$ is multiplied by matrix $\Sigma_{S_{out}S_{out}}(k)$. This effectively applies the output variance of $S_{out}(k)$ to form the residual output spectral coding vector $R_{out}(k)$. Thus $R_{out}(k)$ is a transformed version of $R_{in}(k)$, and describes the way in which $S_{out}(k)$ should deviate from the estimated time-varying output mean vector $\mu_{S_{out}}(k)$. In 613, $R_{out}(k)$ is added to $\mu_{S_{out}}(k)$ to form the final $S_{out}(k)$. In 614, $S_{out}(k)$ is converted to audio output segment $F_{out}(k)$ using inverse transform techniques, and in 615 $F_{out}(k)$ is overlap-added as in 403 of FIG. 4 to generate the output audio signal $A_{out}(t)$.

We now summarize the embodiment of FIG. 6. We want to synthesize an output audio signal $A_{out}(t)$ by transforming pitch, loudness, and spectral characteristics of an input audio signal $A_{in}(t)$. We estimate the time-varying pitch $P_{in}(k)$ of $A_{in}(t)$ (601). We estimate the time-varying spectrum $S_{in}(k)$ and loudness $L_{in}(k)$ of $A_{in}(t)$ (608). We make a guess at the time-varying input spectrum based on previously computed statistics that establish the relationship between input pitch/loudness and input spectrum. This forms the sequence of spectral coding vectors $\mu_{S_{in}}(k)$ (603). The difference between $S_{in}(k)$ and $\mu_{S_{in}}(k)$ forms a residual $R_{in}(k)$ (609). Next, $P_{in}(k)$ and $L_{in}(k)$ are modified to form $P_{out}(k)$ and $L_{out}(k)$ (605), which are used to make a guess at the time-varying sequence of output spectral coding vectors (606). This guess forms $\mu_{S_{out}}(k)$, which is based on previously computed statistics establishing the relationship between output pitch/loudness and output spectrum. Next, we want to apply $R_{in}(k)$ to $\mu_{S_{out}}(k)$ to form the final sequence of output spectral coding vectors $S_{out}(k)$. We want $S_{out}(k)$ to deviate from $\mu_{S_{out}}(k)$ in a manner similar to the way $S_{in}(k)$ deviates from $\mu_{S_{in}}(k)$. To accomplish this, we first transform $R_{in}(k)$ into $R_{out}(k)$ using statistics that reflect the variances of $S_{in}(k)$, the variances of $S_{out}(k)$, and the correlations between $S_{in}(k)$ and $S_{out}(k)$ (602, 605, 607, 610, 611, 612). Finally, we sum $R_{out}(k)$ and $\mu_{S_{out}}(k)$ (613) to form $S_{out}(k)$ and convert $S_{out}(k)$ into $A_{out}(t)$ (614, 615).

The computations of FIG. 6 are simplified if the covariance matrices $\Sigma_{S_{out}S_{out}}(k)$ and $\Sigma_{S_{in}S_{in}}(k)$ are diagonal. This will occur if the elements of the $S_{in}(k)$ vectors associated with each pitch-loudness region are uncorrelated and if the elements of the $S_{out}(k)$ vectors associated with each pitch-loudness region are likewise uncorrelated. For most types of spectral coding vectors the elements of the spectral coding vectors are naturally substantially uncorrelated. So, in one embodiment we simply ignore the elements of $\Sigma_{S_{out}S_{out}}(k)$ and $\Sigma_{S_{in}S_{in}}(k)$ that are off the diagonal.

In another embodiment we find a set of orthogonal basis functions for the $S_{in}(k)$. This is accomplished by eigendecomposition of $\Sigma_{S_{in}S_{in}}$, the covariance matrix of all $S_{in}(k)$ covering all pitch/loudness regions. The resulting eigenvectors form a set of orthogonal basis vectors for $S_{in}(k)$. While these basis vectors effectively diagonalize $\Sigma_{S_{in}S_{in}}$, they do not generally diagonalize $\Sigma_{S_{in}S_{in}}(k)$ which is output from the function $\Sigma_{S_{in}S_{in}}(P,L)$ and, as such, is specific to a particular set of pitch and loudness values. Nevertheless, the use of orthogonalized basis vectors for $S_{in}(k)$ helps to reduce the variance of off diagonal elements in $\Sigma_{S_{in}S_{in}}(k)$ so that these elements can more reasonably be ignored.

In the same manner we find a set of orthogonal basis vectors for $S_{out}(k)$ by eigendecomposition of $\Sigma_{S_{out}S_{out}}$, the covariance matrix of all $S_{out}(k)$ covering all pitch/loudness regions.

In yet another embodiment we find a set of orthogonal basis vectors for every pitch/loudness region $C_q(p,l)$. This is accomplished using eigendecomposition of each matrix $\Sigma_{S_{in}S_{in}}(p,l)$ in the matrix of matrices matrix$(\Sigma_{S_{in}S_{in}})$. Each eigendecomposition yields a set of orthogonal basis vectors for that pitch/loudness region. The matrix $\Sigma_{S_{in}S_{in}}(k)$ in 602 is the result of an interpolating function $\Sigma_{S_{in}S_{in}}(P,L)$ over multiple diagonal matrices associated with different pitch/loudness regions. To obtain the set of basis vectors associated with $\Sigma_{S_{in}S_{in}}(k)$ we also interpolate the basis vectors associated with these same pitch/loudness regions. Thus, each audio frame results in a new set of basis vectors that are the result of interpolation of the basis vectors associated with multiple pitch/loudness regions. This interpolation is based on the pitch $P_{in}(k)$ and loudness $L_{in}(k)$ associated with $S_{in}(k)$.

In a similar manner we can generate a set of orthogonal basis vectors for each output frame $S_{out}(k)$ as a function of $P_{out}(k)$ and $L_{out}(k)$.

The eigendecompositions that lead to diagonal or near-diagonal covariance matrices $\Sigma_{S_{out}S_{out}}(k)$ and $\Sigma_{S_{in}S_{in}}(k)$ also concentrate the variance of $S_{in}(k)$ and $S_{out}(k)$ in the first few vector elements. In one embodiment only the first few elements of the orthogonalized $S_{in}(k)$ and $S_{out}(k)$ vectors are retained. This is the well-known technique of Principal Components Analysis (PCA). One advantage of the reduction in number of elements due to PCA is that the computation associated with the interpolation of different sets of basis vectors from different pitch/loudness regions is reduced because fewer basis vectors are used.

In order to obtain an estimate for $\Omega_{S_{out}S_{in}}(k)$, similar recorded phrases must be available for each pitch loudness region $C_q(p,l)$. The recorded phrases for one region must be time-aligned with the phrases for every other region so that cross-correlations can be computed. A well-known technique called dynamic time-warping can be used to adjust the phrases for best time-alignment.

Suppose we have a set of recordings of phrases spanning different pitch-loudness regions but we do not have a time-aligned set of recorded phrases with the same phrases played in each pitch-loudness region. We can partition the phrases into segments associated with each pitch-loudness region and we can search by hand for phrase segments in each region that closely match phrase segments in the other reasons. We can then use dynamic time-warping to maximize the time-alignment. An automatic tool for finding these matching segments can also be defined. This tool searches for areas of positive cross-correlation between pitch and loudness curves of audio segments associated with different pitch-loudness regions. $\Sigma_{S_{out}S_{in}}$ can then be estimated from these matching time-aligned segments.

Suppose we have diagonalized or nearly diagonalized the $\Sigma_{S_{in}S_{in}}$ and $\Sigma_{S_{out}S_{out}}$ matrices associated with each pitch-loudness region as described above. Suppose also that we assume $\Omega_{S_{out}S_{in}}(k)$ is the identity matrix with unity on the diagonal and zero elsewhere. Then the matrix-vector multiply 611 is eliminated from the embodiment of FIG. 6 and the matrix inversion of 602 and the three matrix vector multiplies 610, 611, 612 reduce to dividing the diagonal elements of $\Sigma_{S_{out}S_{out}}$ by the diagonal elements $\Sigma_{S_{in}S_{in}}$ and multiplying the result by $R_{in}(k)$. This is a particularly simple embodiment of the present invention where $R_{out}(k)$ is equal to $R_{in}(k)$ scaled by the ratio of variances of the $S_{out}(k)$ to $S_{in}(k)$ elements. This simple embodiment is often adequate in practice. In this embodiment $\Omega_{S_{out}S_{in}}(k)$ does not need to be estimated. This means matching phrases in different pitch-loudness regions is not needed. This greatly eases the requirements on the recorded phrases. Any set of idiomatic phrases covering a reasonable range of pitch and loudness can be used.

The use of PCA as described above works particularly well in conjunction with the assumption of an identity $\Omega_{S_{out}S_{in}}(k)$ matrix. With this assumption variation in an input principal component weight translates to similar variation in an output principal component weight even though these components may refer to different actual spectral coding parameters. For example, in the case of harmonic amplitude coding, the first input principal component may be dominated by the first harmonic while the first output principal component may be an equal weighting of first and second harmonics. So, PCA supports a flexible mapping of input to output components even with the identity $\Omega_{S_{out}\ S_{in}}(k)$ matrix assumption.

In one embodiment of the present invention the input functions $\mu_{S_{in}}(P,L)$ and $\Sigma_{S_{in}S_{in}}(P,L)$ are identical to the output functions $\mu_{S_{out}}(P,L)$ and $\Sigma_{S_{out}S_{out}}(P,L)$. That is, they are based on the same analysis data. This is the case when we want to transpose a musical instrument phrase by some pitch and/or loudness interval and we want the spectral characteristics to be modified appropriately so that the transposed phrase sounds natural. In this case, $\mu_{S_x}(P,L)$ and $\Sigma_{S_xS_x}(P,L)$—where "x" stands for "in" or "out"—describe the spectral characteristics for the entire range of pitch and loudness for the instrument and we map from one pitch-loudness area to another in the same instrument.

In one embodiment of the present invention the elements of each $S_{in}(k)$ vector are divided by the scalar square root of the sum of squares, also called the magnitude, of $S_{in}(k)$. The sequence of magnitude values thus serves to normalize $S_{in}(k)$. Since $S_{out}(k)$ is generated from $S_{in}(k)$ it is also normalized. The magnitude sequence is saved separately and is used to denormalize $S_{out}(k)$ before converting to $F_{out}(k)$. Denormalization consists in multiplying $S_{out}(k)$ by the magnitude sequence. Since the vector magnitude is highly correlated with loudness, when $L_{in}(k)$ is modified to form $L_{out}(k)$ in 605 the magnitude sequence must also be modified in a similar manner.

The normalized $S_{in}(k)$ and $S_{out}(k)$ are comprised of elements with values between zero and one. Each value expresses the fraction of the vector magnitude contributed by that vector element. With values limited to the range zero to one, a Gaussian distribution is not ideal. The beta distribution may be more appropriate in this case. The beta distribution is well known to those skilled in the art of statistical modeling. The beta distribution is particularly easy to apply in the case of diagonalized covariance matrices since the multivariate distribution of $S_{in}(k)$ and $S_{out}(k)$ is simply a collection of uncorrelated univariate beta distributions. For possibly asymmetrical distributions, such as the beta distribution, the mean may no longer be identical with the mode—or maximum value—of the distribution. Both mean and mode may be used as the estimate of most probable spectral coding vector without substantially affecting the character of the present invention. It is to be understood that all references to mean vectors $\mu_{S_x}$ and functions returning mean vectors $\mu_{S_x}(p,l)$ discussed above may be replaced by mode or maximum value vectors or functions returning mode or maximum value vectors without affecting the essential character of the present invention.

In the embodiment of FIG. 6, $A_{out}(t)$ is generated as a function of $A_{in}(t)$. This may occur in real-time with analysis of $A_{in}(t)$ being carried out concurrently with generation of $A_{out}(t)$. However, in another embodiment, analysis of $A_{in}(t)$ is carried out "off-line", and the results of the analysis—e.g. $\mu_{S_{in}}(P,L)$ and $\Sigma_{S_{in}S_{in}}(P,L)$—are stored for later use. This does not affect the overall structure of the embodiment of FIG. 6.

Figure 7:
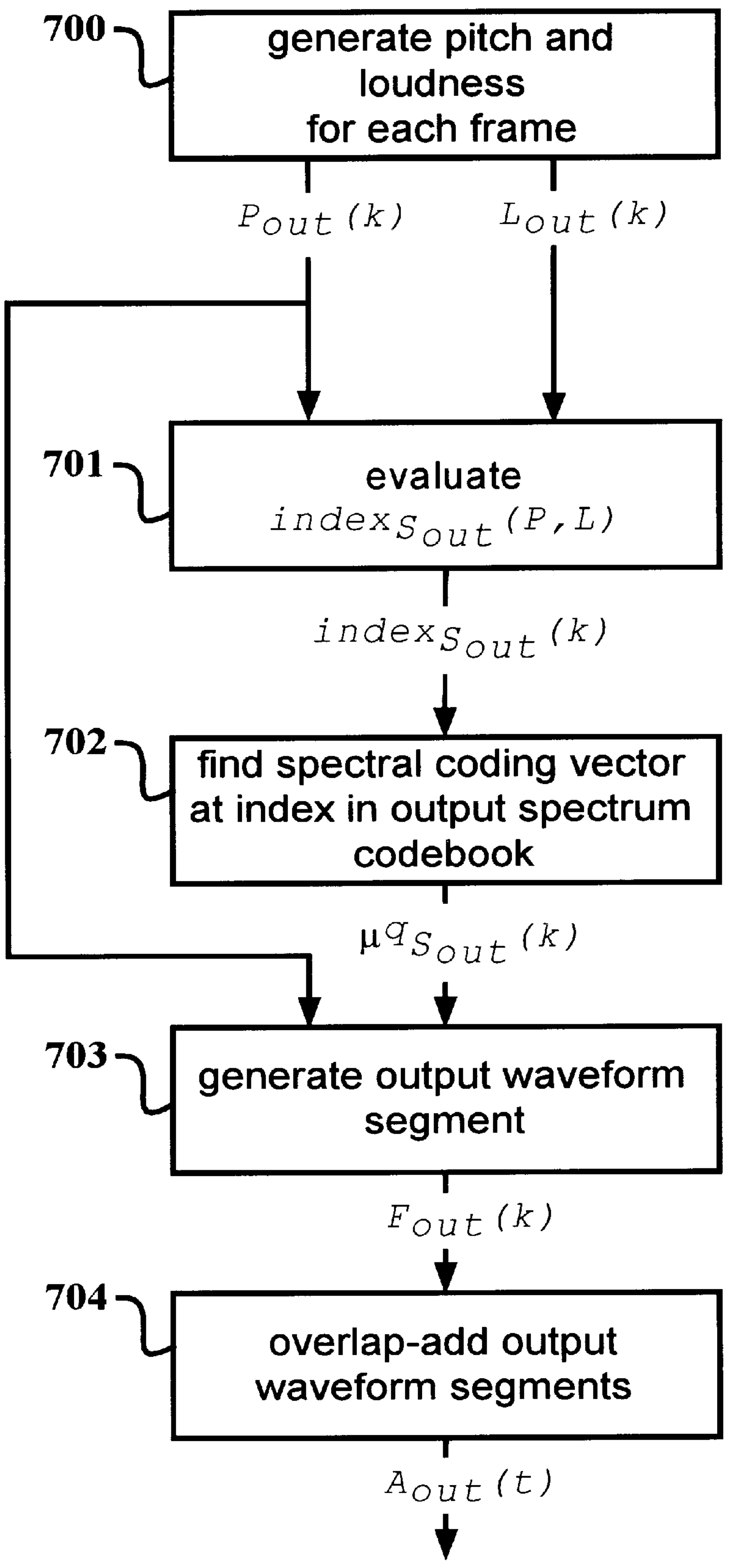
FIG. 7—audio signal synthesis system wherein indices into an output spectrum codebook are determined as a function of output pitch and loudness.

FIG. 7 shows yet another embodiment of the present invention similar to FIG. 4. In 401 of FIG. 4, the function $\mu_{S_{out}}(P,L)$ returns the mean vector $\mu_{S_{out}}(k)$. $\mu_{S_{out}}(P,L)$ is a continuous function of pitch and loudness. By contrast, in 701 of FIG. 7 the function $index_{S_{out}}(P,L)$ returns an index identifying a vector in an output spectral coding vector quantization (VQ) codebook. This VQ codebook holds a discrete set of output spectral coding vectors. The output of 701 is the index to the vector in the VQ codebook that is closest to the most probable vector $\mu_{S_{out}}(k)$. This codebook vector will be referred to as $\mu^q_{S_{out}}(k)$ and can be understood as a quantized version of $\mu_{S_{out}}(k)$. In 702, $\mu^q_{S_{out}}(k)$ is fetched from the codebook. In 703, $\mu^q_{S_{out}}(k)$ is converted to an output waveform segment $F_{out}(k)$ in a manner identical to 402 of FIG. 4. Also in 703, $F_{out}(k)$ is pitch shifted to pitch $P_{out}(k)$. In 704, the pitch shifted output waveform segments are overlap-added to form the output audio signal $A_{out}(t)$.

In a variation of the embodiment of FIG. 7, $\mu^q_{S_{out}}(k)$ is comprised of principal component vector weights. The principal component weights are converted to vectors containing actual spectrum values in 703 by linear transformation using a matrix of principal component vectors, before converting the actual spectrum vectors to time-domain waveforms $F_{out}(k)$.

Figure 8:
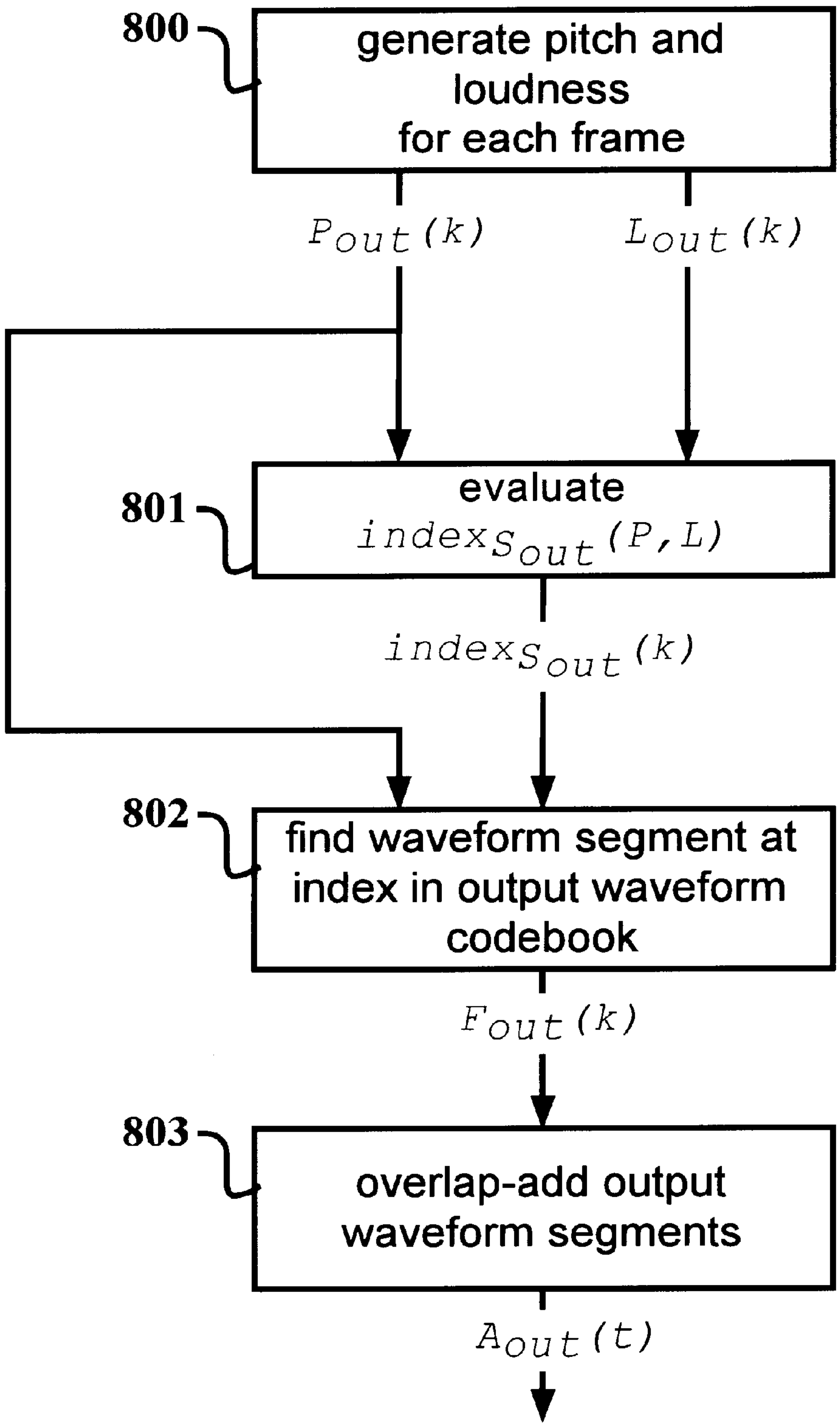
FIG. 8—audio signal synthesis system wherein indices into an output waveform codebook are determined as a function of output pitch and loudness.

The spectral coding vectors in FIG. 7 are selected from a discrete set of VQ codebook vectors. The selected vectors are then converted to time-domain waveform segments. To reduce real-time computation, the codebook vectors can be converted to time-domain waveform segments prior to real-time execution. Thus, the output spectral coding VQ codebook is converted to a time-domain waveform segment VQ codebook. FIG. 8 shows the corresponding embodiment. The output of 801 is $index_{S_{out}}(k)$, which is used in 802 to select a time-domain waveform segment $F_{out}(k)$ having the desired spectrum $\mu^q_{S_{out}}(k)$. The conversion from spectral coding vector to time-domain waveform segment is not needed.

In a variation of the embodiment of FIG. 8, $\mu^q_{S_{out}}(k)$ is comprised of principal component vector weights. In this case, rather than finding $F_{out}(k)$ as a precomputed waveform in a VQ waveform codebook, $F_{out}(k)$ is instead computed as a linear combination of principal component waveforms. The principal component waveforms are the time-domain waveforms corresponding to the spectral principal component vectors. The principal component weights $\mu^q_{S_{out}}(k)$ are then used as linear combination weights in combining the time-domain principal component waveforms to produce $F_{out}(k)$ which is then pitch shifted according to $P_{out}(k)$.

Figure 10:
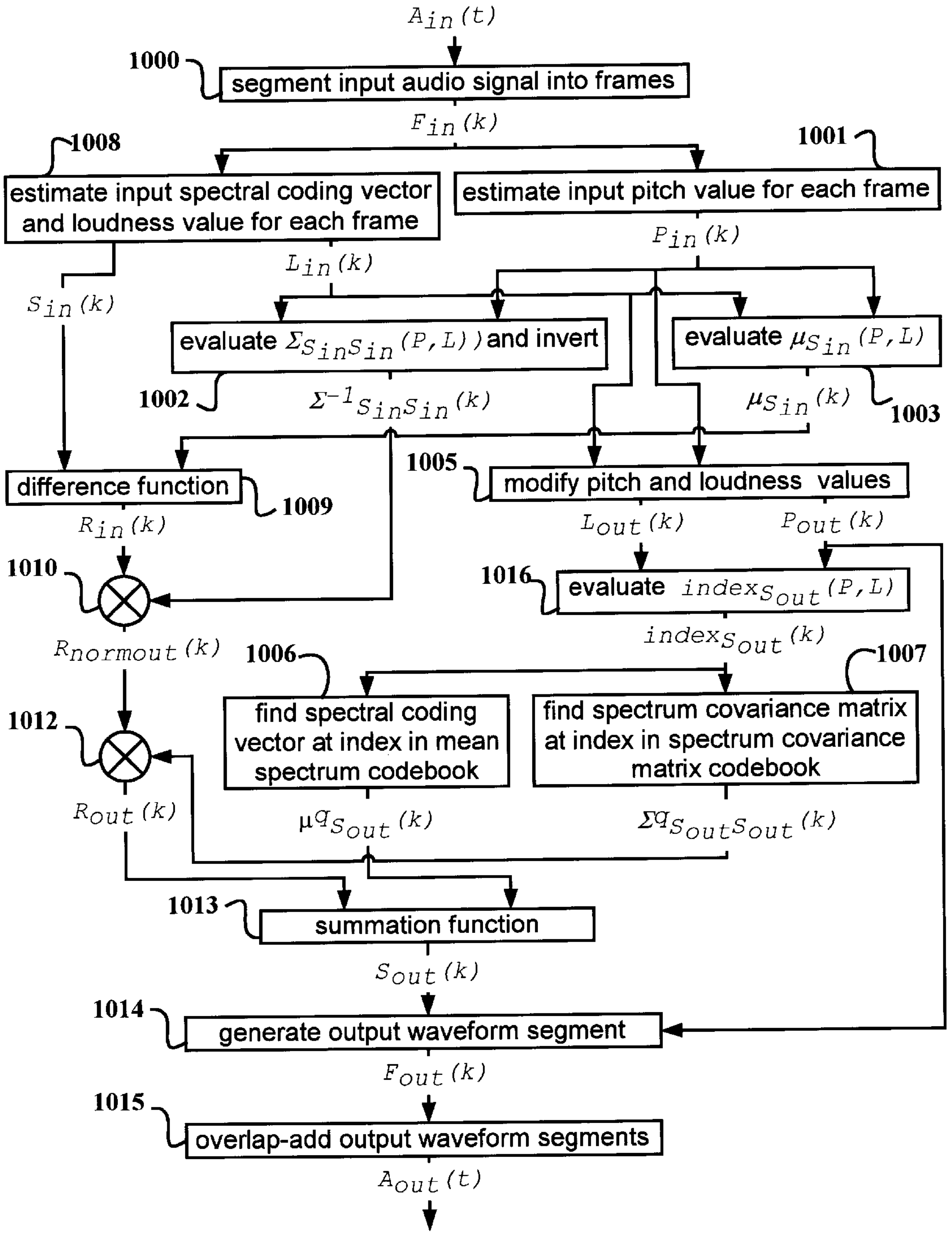
FIG. 10—audio signal synthesis system similar to FIG. 6 wherein the estimation of mean output spectrum and spectrum covariance based on pitch and loudness takes the form of indices in a mean output spectrum codebook and an output spectrum covariance matrix codebook.

FIG. 10 shows yet another embodiment of the present invention. The embodiment of FIG. 10 is similar to that of FIG. 6 but incorporates output spectral coding VQ codebooks. We discuss here only the differences with FIG. 6. In 1005, $P_{in}(k)$ and $L_{in}(k)$ are modified to generate $P_{out}(k)$ and $L_{out}(k)$. This is similar to 605 of FIG. 6 except $\Omega_{S_{out}S_{in}}(k)$ is not generated. In FIG. 10, $\Omega_{S_{out}S_{in}}(k)$ is assumed to be the identity matrix so in 1010 $R_{in}(k)$ is multiplied by $\Sigma_{S_{in}S_{in}}(k)$ to directly produce $R_{normout}(k)$. The multiplication of $R_{normout}(k)$ by $\Omega_{S_{out}S_{in}}(k)$, as in 611 of FIG. 6, is eliminated. In 1016 of FIG. 10 the function $index_{S_{out}}(P,L)$ is evaluated for $P_{out}(k)$ and $L_{out}(k)$ to produce $index_{S_{out}}(k)$. This is similar to 701 of FIG. 7. In 1006 the quantized mean vector $\mu^q_{S_{out}}(k)$ is fetched from location $index_{S_{out}}(k)$ in the mean spectrum codebook in a manner similar to 702 of FIG. 7. In 1007, $\Sigma^q_{S_{out}S_{out}}(k)$ is fetched from location $index_{S_{out}}(k)$ in the spectrum covariance matrix codebook. $\Sigma^q_{S_{out}S_{out}}(k)$ is a vector quantized version of the covariance matrix of output spectral coding vectors $\Sigma_{S_{out}S_{out}}(k)$. The remainder of FIG. 10 is similar to FIG. 6. In 1012, $R_{normout}(k)$ is multiplied by $\Sigma^q_{S_{out}S_{out}}(k)$ to form $R_{out}(k)$. In 1013, $R_{out}(k)$ is added to $\mu^q_{S_{out}}(k)$ to form $S_{out}(k)$, which is converted to waveform segment $F_{out}(k)$ in 1014. In 1015, $F_{out}(k)$ is overlap-added to form $A_{out}(t)$.

Figure 11:
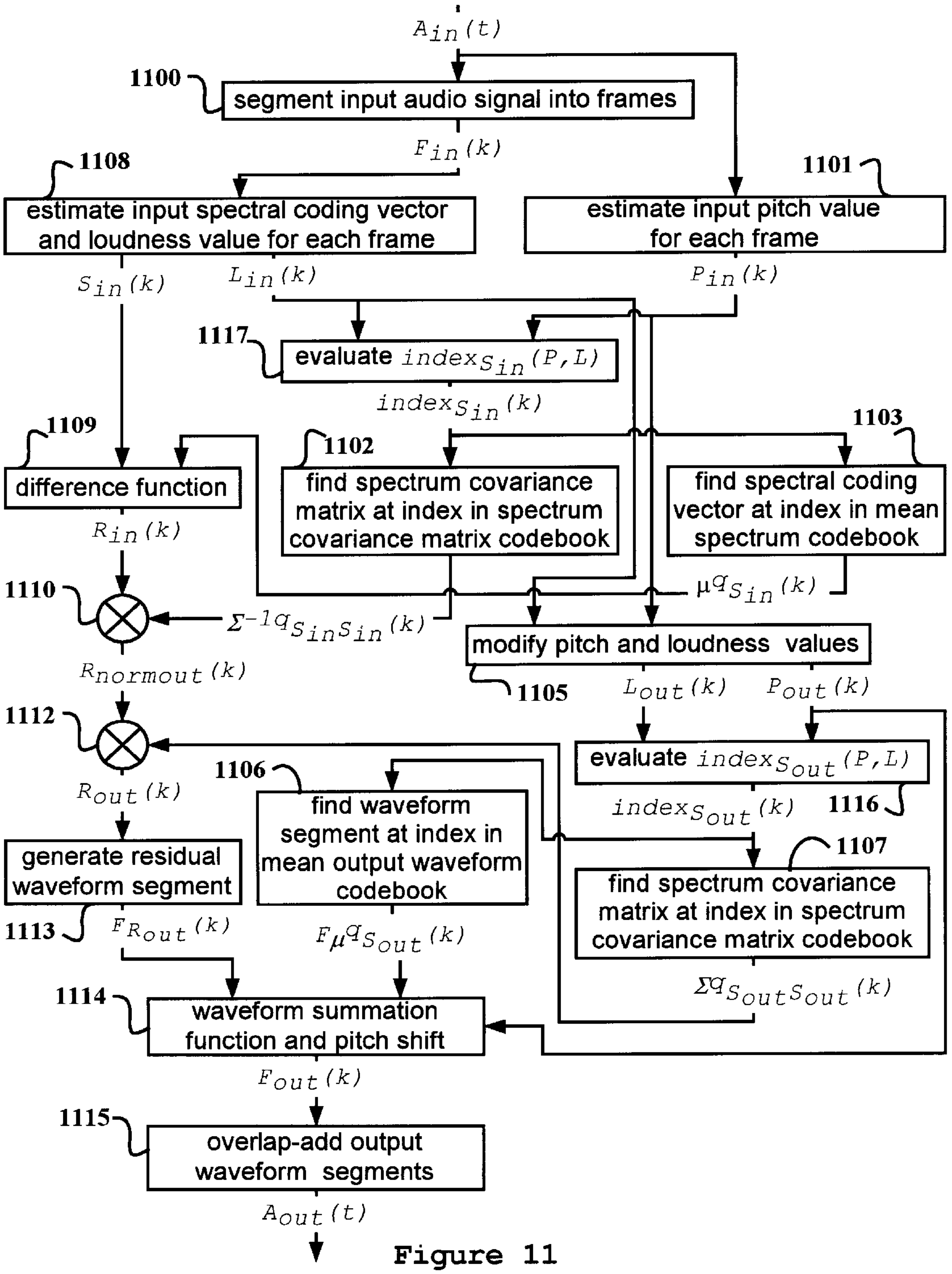
FIG. 11—audio signal synthesis system similar to FIG. 10 wherein the estimation of most probable input spectrum takes the form of indices in a mean input spectrum codebook and an input spectrum covariance matrix codebook.

FIG. 11 shows yet another embodiment of the present invention. FIG. 11 is similar to FIG. 10 but makes more use of VQ techniques. Specifically, in 1117 the function $index_{S_{in}}(P,L)$ is evaluated based on $P_{in}(k)$ and $L_{in}(k)$ to generate $index_{S_{in}}(k)$. In 1103, an input mean spectral coding vector $\mu^q_{S_{in}}(k)$ is fetched from location $index_{S_{in}}(k)$ in an input spectral coding VQ codebook. In 1102, the inverse of input covariance matrix $\Sigma^q_{S_{in}S_{in}}(k)$ is fetched from location $index_{S_{in}}(k)$ in an input spectrum covariance matrix codebook. The difference between $S_{in}(k)$ and $\mu^q_{S_{in}}(k)$ is formed in 1109 to generate $R_{in}(k)$, which is multiplied by the inverse of $\Sigma^q_{S_{in}S_{in}}(k)$ in 1110 to form $R_{normout}(k)$. $P_{in}(k)$ and $L_{in}(k)$ are modified in 1105 to form $P_{out}(k)$ and $L_{out}(k)$. In 1116, $index_{S_{out}}(P,L)$ is evaluated based on $P_{out}(k)$ and $L_{out}(k)$ to generate $index_{S_{out}}(k)$. In 1106, mean output time-domain waveform segment $F_{\mu^q S_{out}}(k)$ is fetched from location $index_{S_{out}}(k)$ in a mean output waveform segment VQ codebook. In 1107, the matrix $\Sigma^q_{S_{out}S_{out}}(k)$ is fetched from location $index_{S_{out}}(k)$ in an output covariance matrix codebook. In 1112, $R_{normout}(k)$ is multiplied by $\Sigma^q_{S_{out}S_{out}}(k)$ to form residual output spectral coding vector $R_{out}(k)$ that is transformed to a residual output time-domain waveform segment $F_{R_{out}}(k)$ in 1113. In 1114, the two time-domain waveform segments $F_{R_{out}}(k)$ and $F_{\mu^q S_{out}}(k)$ are summed to form the output waveform $F_{out}(k)$ that is overlap-added in 1115 to form $A_{out}(t)$.

In a related patent application by the present inventor, U.S. Utility patent application Ser. No. 09/306,256, Lindemann teaches a type of spectral coding vector comprising a limited number of sinusoidal components in combination with a waveform segment VQ codebook. Since this spectral coding vector type includes both sinusoidal components and VQ components it can be supported by treating each spectral coding vector as two vectors: a sinusoidal vector and a VQ vector. In the case of embodiments that do not include residuals the embodiment of FIG. 1, FIG. 4, or FIG. 9 is used for the sinusoidal component vectors and the embodiment of FIG. 7 or FIG. 8 is used for the VQ component vectors. In the case of embodiments that do include residuals, the embodiment of FIG. 6 is used for sinusoidal component vectors and the embodiment of FIG. 10 or FIG. 11 is used for VQ component vectors.

I claim:

1. A method for synthesizing an output audio signal, comprising the steps of:

generating a time-varying sequence of output pitch values;

generating a time-varying sequence of output loudness values;

computing the most probable sequence of output spectral coding vectors given said time-varying sequence of output pitch values and said time-varying sequence of output loudness values, wherein said most probable sequence of output spectral coding vectors is a function of an output conditional probability density function of output spectral coding vectors conditioned on pitch and loudness values; and generating said output audio signal from said sequence of output spectral coding vectors.

2. The method according to claim 1 wherein said most probable sequence of output spectral coding vectors is the mean of said conditional probability density function of output spectral coding vectors conditioned on pitch and loudness values.

3. The method according to claim 1 wherein said most probable sequence of output spectral coding vectors is the maximum value of said conditional probability density function of output spectral coding vectors conditioned on pitch and loudness values.

4. The method according to claim 1 wherein said step of generating said output audio signal further includes the step of shifting the pitch of said output audio signal.

5. The method according to claim 1 wherein said step of generating said output audio signal further includes the step of generating successive time-domain waveform segments and overlap-adding said segments to form said output audio signal.

6. The method according to claim 1 wherein said step of generating said output audio signal further includes the step of generating successive time-domain waveform segments and concatenating said segments to form said output audio signal.

7. The method according to claim 1 further including the step of filtering said most probable sequence of output spectral coding vectors over time to form a filtered sequence of output spectral coding vectors.

8. The method according to claim 1 wherein said output spectral coding vectors include frequencies and amplitudes of a set of sinusoids.

9. The method according to claim 8 wherein said output spectral coding vectors further include phases of said set of sinusoids.

10. The method according to claim 8 wherein said frequencies are values which are multiplied by a fundamental frequency.

11. The method according to claim 1 wherein said output spectral coding vectors comprise amplitudes of a set of harmonically related sinusoids.

12. The method according to claim 11 wherein said output spectral coding vectors further include phases for said set of harmonically related sinusoids.

13. The method according to claim 1 wherein said step of generating said output audio signal further includes the steps of:

generating a set of sinusoids using a sinusoidal oscillator bank; and summing said set of sinusoids.

14. The method according to claim 1 wherein said step of generating said output audio signal further includes the step of generating a set of summed sinusoids using an inverse Fourier transform.

15. The method according to claim 1 wherein said output spectral coding vectors include amplitude spectrum values across frequency.

16. The method according to claim 1 wherein said output spectral coding vectors include cepstrum values.

17. The method according to claim 1 wherein said output spectral coding vectors include log amplitude spectrum values across frequency.

18. The method according to claim 1 wherein said output spectral coding vectors represent the frequency response of a spectral shaping filter used to shape the spectrum of a signal whose initial spectrum is substantially flat.

19. A method for analyzing an input audio signal to produce a conditional mean function that returns a mean spectral coding vector given particular values of pitch and loudness wherein said conditional mean function is used in a system for synthesizing an audio signal, comprising the steps of:

segmenting said input audio signal into a sequence of analysis audio frames;

generating an analysis loudness value for each said analysis audio frame;

generating an analysis pitch value for each said analysis audio frame;

converting said sequence of analysis audio frames into a sequence of spectral coding vectors;

partioning said spectral coding vectors into pitch-loudness regions;

generating a mean spectral coding vector associated with each said pitch-loudness region by performing, for each said pitch-loudness region, the step of computing the mean of all spectral coding vectors associated with said pitch-loudness region; and fitting a set of interpolating surfaces to said mean spectral coding vectors, wherein each said surface corresponds to a function of pitch and loudness that returns the value of a particular spectral coding vector element, wherein said functions taken together correspond to said conditional mean function.

20. The method according to claim 19 wherein said step of fitting a set of interpolating surfaces to said mean spectral coding vectors further includes the step of fitting said interpolating surfaces with a linear interpolation function.

21. The method according to claim 19 wherein said step of fitting a set of interpolating surfaces to said mean spectral coding vectors further includes the step of fitting said interpolating surfaces with a spline interpolation function.

22. The method according to claim 19 wherein said step of fitting a set of interpolating surfaces to said mean spectral coding vectors further includes the step of fitting said interpolating surfaces with a polynomial interpolation function.

23. The method according to claim 19 wherein said step of fitting a set of interpolating surfaces to said mean spectral coding vectors further includes weighting said fitting according to the number of spectral coding vectors associated with each said pitch-loudness region.

24. The method according to claim 19 wherein said pitch-loudness regions are overlapping so that a spectral coding vector may be assigned to more than one pitch-loudness region.

25. A method for analyzing an input audio signal to produce a conditional covariance function that returns a spectrum covariance matrix given particular values of pitch and loudness wherein said conditional covariance function is used in a system for synthesizing an audio signal, comprising the steps of:

segmenting said input audio signal into a sequence of analysis audio frames;

generating an analysis loudness value for each said analysis audio frame;

generating an analysis pitch value for each said analysis audio frame;

converting each said sequence of analysis audio frames into a sequence of spectral coding vectors;

partioning said spectral coding vectors into pitch-loudness regions;

generating a spectrum covariance matrix associated with each said pitch-loudness region by performing, for each said pitch-loudness region, the step of computing the covariance matrix of all spectral coding vector elements associated with said pitch-loudness region; and fitting a set of interpolating surfaces to said spectral coding vector covariance matrices, wherein each said surface corresponds to a function of pitch and loudness that returns the value of a particular spectrum covariance matrix element, wherein said functions taken together correspond to said conditional covariance function.

26. The method according to claim 25 wherein said step of fitting a set of interpolating surfaces to said spectral coding vector covariance matrices further includes the step of fitting said interpolating surfaces with a linear interpolation function.

27. The method according to claim 25 wherein said step of fitting a set of interpolating surfaces to said spectral coding vector covariance matrices further includes the step of fitting said interpolating surfaces with a spline interpolation function.

28. The method according to claim 25 wherein said step of fitting a set of interpolating surfaces to said spectral coding vector covariance matrices further includes the step of fitting said interpolating surfaces with a polynomial interpolation function.

29. The method according to claim 25 wherein said step of fitting a set of interpolating surfaces to said mean spectral coding vectors further includes weighting said fitting according to the number of spectral coding vectors associated with each said pitch-loudness region.

30. The method according to claim 25 wherein said pitch-loudness regions are overlapping so that a spectral coding vector may be associated with more than one pitch-loudness region.

31. The method according to claim 1 wherein synthesizing said output audio signal is further responsive to an input audio signal, and further including the steps of:

estimating a time-varying sequence of input pitch values based on said input audio signal;

estimating a time-varying sequence of input loudness values based on said input audio signal;

estimating a sequence of input spectral coding vectors based on said input audio signal;

estimating the most probable sequence of input spectral coding vectors given said time-varying sequence of input pitch values and said time-varying sequence of input loudness values, wherein said most probable sequence of input spectral coding vectors is a function of an input conditional probability density function of input spectral coding vectors conditioned on pitch and loudness values;

computing a sequence of residual input spectral coding vectors by using a difference function to measure the difference between said sequence of input spectral coding vectors and said most probable sequence of input spectral coding vectors; and computing a sequence of residual output spectral coding vectors based on said sequence of residual input spectral coding vectors; and wherein said step of generating said time-varying sequence of output pitch values includes modifying said time-varying sequence of input pitch values; and wherein said step of generating said time-varying sequence of output loudness values includes modifying said time-varying sequence of input loudness values; and wherein said step of computing a sequence of output spectral coding vectors further includes the step of combining said most probable sequence of output spectral coding vectors with said sequence of residual output spectral coding vectors.

32. The method according to claim 31 further including the steps of:

estimating a sequence of input spectrum covariance matrices given said time-varying sequence of input pitch values and said time-varying sequence of input loudness values, wherein said sequence of input spectrum covariance matrices is a function of an input conditional probability density function of input spectral coding vectors conditioned on pitch and loudness values; and estimating a sequence of output spectrum covariance matrices given said time-varying sequence of output pitch values and said time-varying sequence of output loudness values, wherein said sequence of output spectrum covariance matrices is a function of an output conditional probability density function of output spectral coding vectors conditioned on pitch and loudness values; and wherein said step of computing a sequence of residual output spectral coding vectors based on said sequence of residual input spectral coding vectors further includes the steps of a) multiplying each residual input spectral coding vector in said sequence of residual input spectral coding vectors by the inverse of the corresponding covariance matrix in said sequence of input spectrum covariance matrices to form a sequence of normalized residual input spectral coding vectors, and b) generating a sequence of normalized residual output spectral coding vectors based on said sequence of normalized residual input spectral coding vectors, and c) multiplying each said normalized residual output spectral coding vector in said sequence of normalized residual output spectral coding vectors by the corresponding covariance matrix in said sequence of output spectrum covariance matrices to form said sequence of residual output spectral coding vectors.

33. The method according to claim 32 further including the step of:

generating a sequence of normalized input to normalized output spectrum cross-covariance matrices; and wherein said step of computing a sequence of normalized residual output spectral coding vectors based on said sequence of normalized residual input spectral coding vectors further includes the step of multiplying said sequence of normalized residual input spectral coding vectors by the corresonding cross-covariance matrix in said sequence of normalized input to normalized output spectrum cross-covariance matrices.

34. The method according to claim 32 further including the steps of:

recoding said sequence of input spectral coding vectors in terms of a set of input principal component vectors;

recoding said sequence of most probable input spectral coding vectors in terms of said set of input principal component vectors; and recoding said sequence of output spectral coding vectors in terms of a set of output principal component vectors.

35. The method according to claim 34 wherein:

said set of input principal component vectors is specifically selected for each pitch-loudness region; and said set of output principal component vectors is specifically selected for each pitch-loudness region.

36. The method according to claim 31 wherein said input conditional probability density function and said output conditional probability density function are the same.

37. The method according to claim 31 wherein the elements of each spectral coding vector in said sequence of input spectral coding vectors are normalized by dividing by the magnitude of the spectral coding vector.

38. The method according to claim 31 wherein said sequence of input spectral coding vectors is precomputed and stored in a storage means to form a stored sequence of input spectral coding vectors, and wherein said stored sequence of input spectral coding vectors is fetched from said storage means during the process of synthesizing said output audio signal.

39. The method according to claim 31 wherein said most probable sequence of input spectral coding vectors is precomputed and stored in a storage means to form a stored most probable sequence of input spectral coding vectors, and wherein said stored most probable sequence of input spectral coding vectors is fetched from said storage means during the process of synthesizing said output audio signal.

40. The method according to claim 31 wherein:

said sequence of input pitch values is precomputed and stored in a storage means to form a stored sequence of input pitch values, and wherein said stored sequence of input pitch values is fetched from said storage means during the process of synthesizing said output audio signal; and said sequence of input loudness values is precomputed and stored in a storage means to form a stored sequence of input loudness values, and wherein said stored sequence of input loudness values is fetched from said storage means during the process of synthesizing said output audio signal.

41. The method according to claim 31 wherein said sequence of residual input spectral coding vectors is precomputed and stored in a storage means to form a stored sequence of residual input spectral coding vectors, and wherein said stored sequence of residual input spectral coding vectors is fetched from said storage means during the process of synthesizing said output audio signal.

42. The method according to claim 1 wherein the step of computing the most probable sequence of output spectral coding vectors given said time-varying sequence of output pitch values and said time-varying sequence of output loudness values includes the steps of:

generating a sequence of output indices into an output spectral coding vector quantization codebook containing a set of output spectral coding vectors; and for each output index in said sequence of output indices, fetching the output spectral coding vector at the location specified by said output index in said output spectral coding vector quantization codebook, to form said most probable sequence of output spectral coding vectors.

43. The method according to claim 1 wherein the step of computing the most probable sequence of output spectral coding vectors given said time-varying sequence of output pitch values and said time-varying sequence of output loudness values includes the steps of:

generating a sequence of output indices into an output waveform codebook; and wherein the step of generating said output audio signal from said sequence of output spectral coding vectors further includes the steps of:

a) for each output index in said sequence of output indices, fetching the waveform at the location specified by said output index in said output waveform codebook to form a sequence of output waveforms, b) pitch shifting said output waveforms in said sequence of output waveforms, and c) combining said output waveforms to form said output audio signal.

44. The method according to claim 31 wherein the step of estimating the most probable sequence of input spectral coding vectors given said time-varying sequence of input pitch values and said time-varying sequence of input loudness values includes the steps of:

generating a sequence of input indices into an input spectral coding vector quantization codebook containing a set of input spectral coding vectors; and for each input index in said sequence of input indices, fetching the input spectral coding vector at the location specified by said input index in said input spectral coding vector quantization codebook, to form said most probable sequence of input spectral coding vectors.

45. The method according to claim 32 wherein the step of estimating the most probable sequence of input spectrum covariance matrices given said time-varying sequence of input pitch values and said time-varying sequence of input loudness values further includes the steps of:

generating a sequence of input indices into an input spectrum covariance matrix codebook containing a set of input spectrum covariance matrices; and for each input index in said sequence of input indices, fetching the input spectrum covariance matrix at the location specified by said input index in said input spectrum covariance matrix codebook, to form said most probable sequence of input spectrum covariance matrices.

46. The method according to claim 32 wherein the step of estimating the most probable sequence of output spectrum covariance matrices given said time-varying sequence of output pitch values and said time-varying sequence of output loudness values includes the steps of:

generating a sequence of output indices into an output spectrum covariance matrix codebook containing a set of output spectrum covariance matrices; and for each output index in said sequence of output indices, fetching the output spectrum covariance matrix at the location specified by said output index in said output spectrum covariance matrix codebook, to form said most probable sequence of output spectrum covariance matrices.

47. The method according to claim 1 wherein said sequence of output spectral coding vectors includes a sequence of output sinusoidal parameters and a sequence of indices into an output spectral coding vector quantization codebook.

48. The method according to claim 31 wherein said sequence of input spectral coding vectors includes a sequence of input sinusoidal parameters and a sequence of indices into an input spectral coding vector quantization codebook.

49. An appartus for synthesizing an output audio signal, comprising:

means for generating a time-varying sequence of output pitch values;

means for generating a time-varying sequence of output loudness values;

means for computing the most probable sequence of output spectral coding vectors given said time-varying sequence of output pitch values and said time-varying sequence of output loudness values, wherein said most probable sequence of output spectral coding vectors is a function of an output conditional probability density function of output spectral coding vectors conditioned on pitch and loudness values; and means for generating said output audio signal from said sequence of output spectral coding vectors.

50. The apparatus of claim 49 wherein said apparatus for synthesizing said output audio signal is further responsive to an input audio signal, and further comprising:

means for estimating a time-varying sequence of input pitch values based on said input audio signal;

means for estimating a time-varying sequence of input loudness values based on said input audio signal;

means for estimating a sequence of input spectral coding vectors based on said input audio signal;

means for estimating the most probable sequence of input spectral coding vectors given said time-varying sequence of input pitch values and said time-varying sequence of input loudness values, wherein said most probable sequence of input spectral coding vectors is a function of an input conditional probability density function of input spectral coding vectors conditioned on pitch and loudness values;

means for computing a sequence of residual input spectral coding vectors by using a difference function to measure the difference between said sequence of input spectral coding vectors and said most probable sequence of input spectral coding vectors; and means for computing a sequence of residual output spectral coding vectors based on said sequence of residual input spectral coding vectors; and wherein said means for generating said time-varying sequence of output pitch values further includes means for modifying said time-varying sequence of input pitch values; and wherein said means for generating said time-varying sequence of output loudness values further includes means for modifying said time-varying sequence of input loudness values; and wherein said means for computing a sequence of output spectral coding vectors further includes means for combining said most probable sequence of output spectral coding vectors with said sequence of residual output spectral coding vectors.

* * * * *